(12) United States Patent
Schott et al.

(10) Patent No.: US 11,614,343 B2
(45) Date of Patent: Mar. 28, 2023

(54) POSITION SENSOR SYSTEM AND METHOD

(71) Applicant: Melexis Technologies SA, Bevaix (CH)

(72) Inventors: Christian Schott, Bevaix (CH); Gael Close, Bevaix (CH); Bruno Brajon, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 17/544,014

(22) Filed: Dec. 7, 2021

(65) Prior Publication Data
US 2022/0196435 A1    Jun. 23, 2022

(30) Foreign Application Priority Data

Dec. 23, 2020   (EP) ..................... 20217151

(51) Int. Cl.
*G01D 5/14*     (2006.01)
*G01D 5/24*     (2006.01)
*G01D 5/244*    (2006.01)

(52) U.S. Cl.
CPC ............ *G01D 5/145* (2013.01); *G01D 5/244* (2013.01)

(58) Field of Classification Search
CPC ............................ G01D 5/145; G01D 5/2451
See application file for complete search history.

(56) References Cited

U.S. PATENT DOCUMENTS

| | | | |
|---|---|---|---|
| 10,527,455 B2 * | 1/2020 | Schliesch | G01D 5/145 |
| 2017/0307416 A1 | 10/2017 | Tsukamoto et al. | |
| 2019/0101413 A1 | 4/2019 | Murata | |
| 2020/0149925 A1 * | 5/2020 | Bidaux | G01R 33/022 |

FOREIGN PATENT DOCUMENTS

| | | |
|---|---|---|
| DE | 10060287 A1 | 6/2001 |
| EP | 3650816 A1 | 5/2020 |

OTHER PUBLICATIONS

Extended Search Report from corresponding EP Application No. 20217151.8, dated Jun. 7, 2021.

* cited by examiner

*Primary Examiner* — Reena Aurora
(74) *Attorney, Agent, or Firm* — Workman Nydegger; Justin Cassell

(57) ABSTRACT

A position sensor system is arranged for determining a position of a sensor device movable along a predefined path relative to a magnetic source. The system includes the magnetic source and the sensor device. The magnetic source has a first plurality of magnetic pole pairs arranged along a first track and a second plurality of magnetic pole pairs arranged along a second track, centrelines of the tracks are spaced apart by a predefined track distance. The sensor device is configured for measuring at least two orthogonal magnetic field components at a first sensor location, and at least two second orthogonal magnetic field components at a second sensor location. The first and second sensor location are spaced apart by a predefined sensor distance smaller than the predefined track distance, in a direction transverse to the tracks.

15 Claims, 18 Drawing Sheets

$$\begin{cases} B_{Sin1} = a1 * B_{axial,1} + a2 * B_{axial,2} \\ B_{Cos1} = b1 * B_{tang,1} + b2 * B_{tang,2} \end{cases}$$

$$\begin{cases} B_{Sin2} = c1 * B_{axial,2} + c2 * B_{axial,1} \\ B_{Cos2} = d1 * B_{tang,2} + d2 * B_{tang,1} \end{cases}$$

FIG. 4

Bz1 ~ HH1   Bz2 ~ HH2   Bz3 ~ HH3   Bz4 ~ HH4
Bx1 ~ VH1   Bx2 ~ VH3   Bx3 ~ VH5   Bx4 ~ VH7
By1 ~ VH2   By2 ~ VH4   By3 ~ VH6   By4 ~ VH8 dBy/dy(at P1) ~ By1-By3     dBy/dy(at P2) ~ By2-By4
dBz/dy(at P1) ~ Bz1-Bz3     dBz/dy(at P2) ~ Bz2-Bz4 dBx/dx(at P1) ~ Bx1-Bx2

FIG. 12    1200

POSITION SENSOR SYSTEM AND METHOD

FIELD OF THE INVENTION

The present invention relates in general to the field of magnetic sensor systems and magnetic sensor devices and methods of determining a position, and more in particular to linear and angular position sensor systems, linear and angular position sensor devices, and methods of determining a linear or an angular position.

BACKGROUND OF THE INVENTION

Magnetic sensor systems, in particular angular position sensor systems are known in the art. They offer the advantage of being able to measure an angular position without making physical contact, thus avoiding problems of mechanical wear, scratches, friction, etc.

Many variants of position sensor systems exist, addressing one or more of the following requirements: using a simple or cheap magnetic structure, using a simple or cheap sensor device, being able to measure over a relatively large range, being able to measure with great accuracy, requiring only simple arithmetic, being able to measure at high speed, being highly robust against positioning errors, being highly robust against an external disturbance field, providing redundancy, being able to detect an error, being able to detect and correct an error, having a good signal-to-noise ratio (SNR), etc.

Often two or more of these requirements conflict with each other, hence a trade-off needs to be made.

There is always room for improvements or alternatives.

SUMMARY OF THE INVENTION

It is an object of embodiments of the present invention to provide a position sensor system, a position sensor device, and a method of determining a position of a sensor device relative to a magnetic source having a plurality of magnetic poles.

It is an object of embodiments of the present invention to provide such a system and device and method, which provide an improved accuracy.

It is an object of embodiments of the present invention to provide such a system and device and method, which are suitable for use in an industrial and/or automotive environment.

It is an object of embodiments of the present invention to provide such a position sensor system, wherein the cost of the position sensor device is reduced (e.g. smaller chip area).

It is an object of embodiments of the present invention to provide such a position sensor system, wherein the semiconductor substrate of the position sensor device has a reduced footprint.

It is an object of embodiments of the present invention to provide such a position sensor system, wherein the mounting requirements of the sensor device are relaxed.

It is an object of embodiments of the present invention to provide such a position sensor system, that is more robust against ageing effects, (e.g. related to misalignment, mechanical wear).

It is an object of embodiments of the present invention to provide such a position sensor system, requiring a less powerful processor, and/or requiring less processing power.

It is an object of embodiments of the present invention to provide such a position sensor system, requiring less storage space (e.g. to store a lower number of coefficients).

It is an object of embodiments of the present invention to provide such a position sensor system, which is substantially insensitive to an external disturbance field.

These and other objectives are accomplished by embodiments of the present invention.

According to a first aspect, the present invention provides a position sensor system for determining a position of a sensor device movable along a predefined path relative to a magnetic source or vice versa, the position sensor system comprising: said magnetic source comprising a first plurality (N1) of magnetic pole pairs arranged along a first track having a first periodicity, and comprising a second plurality (N2) of magnetic pole pairs arranged along a second track having a second periodicity different from the first periodicity, wherein a centreline of the first track is spaced from a centreline of the second track by a predefined track distance; said sensor device being configured for measuring a first set of a least two orthogonal magnetic field components (e.g. By1, Bz1) at a first sensor location, and for measuring a second set of at least two orthogonal magnetic field components (e.g. By2, Bz2) at a second sensor location, wherein the first sensor location is spaced from the second sensor location by a predefined sensor distance smaller than the predefined track distance, e.g. at least 20% smaller, in a direction transverse to the tracks (e.g. substantially perpendicular to the tracks); and wherein the sensor device further comprises a processing unit configured for determining said position based on at least some of the measured signals.

It is a major advantage of this system that the dimensions of the sensor device, in particular the distance between the sensor elements can be chosen independent from the distance between the tracks of the magnetic source. This makes it possible (inter alia) to optimise the magnetic sensor device and the magnetic source independent from each other.

It is a major advantage of the system that the distance between the sensor elements is smaller than the distance between the tracks of the magnetic source, because this allows the size and the costs of the semiconductor substrate of the sensor device to be reduced.

It is an advantage of this system wherein the magnetic source comprises a first track with the first periodicity and a second track with the second periodicity, instead of only a single track with multiple periodicities, because the latter is more difficult (and thus more expensive) to produce.

The magnetic source may be or may comprise one or more permanent magnets or may be formed as a monolithic piece of magnetic material or may be composed of two monolithic pieces of magnetic material, such as for example two linear strips, or two magnetic rings mounted together.

In an embodiment, a ratio of the first number of pole pairs (N1) and the second number of pole pairs (N2) is (N-1)/N, where N is an integer number in the range from 5 to 32, preferably in the range from 5 to 16, for example N1=4 and N2=5, or N1=5 and N2=6, or N1=6 and N2=7, or . . . , or N1=31 and N2=21.

In an embodiment, a ratio of the first number of pole pairs (N1) and the second number of pole pairs (N2) is (N-2)/N, where N is an odd integer number in the range from 5 to 31, preferably in the range from 5 to 17, for example N1=5 and N2=7, or N1=7 and N2=9, or N1=9 and N2=11, or N1=11 and N2=13, or N1=13 and N2=15, or N1=15 and N1=17, or N1=17 and N2=19, or N1=19 and N2=21, or N1=21 and N2=23, or N1=23 and N2=25, or N1=25 and N2=27, or N1=27 and N2=29, or N1=29 and N2=31.

In an embodiment, the magnetic source comprises two rings of magnetic material, spaced from each other by a layer or a zone of a non-magnetic material, such as e.g.

plastic or ceramic or a non-magnetic metal or alloy, e.g. aluminum or copper. The non-magnetic material may have a thickness of at least 0.5 mm, or a thickness in the range from about 0.5 mm to 1.5 mm. In case the two rings are concentric rings arranged as shown in FIG. 15(a), they may each have a width (in the radial direction) of about 2.0 mm to about 5.0 mm. In case the two rings having the same radius, and are arranged as shown in FIG. 15(b), they may each have a width (in the axial direction) of about 2.0 to about 5.0 mm.

In an embodiment, the magnetic source comprises two substantially linear strips of magnetic material, spaced from each other by a layer or a zone of a non-magnetic material. The non-magnetic material may have a thickness of at least 0.5 mm, or a thickness in the range from about 0.5 mm to 1.5 mm. Alternatively, the two strips are separated from each other by means of groove.

In an embodiment, the predefined sensor distance is 20% to 80% of the predefined track distance. Or in other words, a ratio of the sensor distance "ds" over the track distance "dt" is a value in the range from 20% to 80%.

In an embodiment, the predefined sensor distance (ds) is a value in the range from 1.0 to 3.0 mm, or in the range from 1.5 mm to 2.5 mm, and the predefined track distance (dt) is at least 20% or at least 30% or at least 40% or at least 50% or at least 60% or at least 70% or at least 80% or at least 90% larger than the predefined sensor distance.

In an embodiment, the predefined sensor distance (ds) is at most 75% of the predefined track distance (dt), or at most 70%, or at most 65%, or at most 60%.

In an embodiment, the ratio (ds/dt) is at most 80%, or at most 75%, or at most 70%, or at most 65%, or at most 60%, or at most 65%, or at most 50%, or at most 45%, or at most 40%, or at most 35%, or at most 30%, or at most 25%, or at most 20%.

In an embodiment, the predefined sensor distance (ds) is at least 20% of the predefined track distance (dt), or at least 25%, or at least 30%, or at least 35%, or at least 40%, or at least 45%, or at least 50%.

In an embodiment, the ratio (ds/dt) is at least 20%, or at least 25%, or at least 30%, or at least 35%, or at least 40%, or at least 45%, or at least 50%.

In an embodiment, the position sensor system is an angular position sensor system.

In an embodiment, the measurement range is 360°.

In an embodiment, the magnetic source is rotatable about a rotation axis; and the first track and the second track are concentric circular tracks located in a single plane perpendicular to the rotation axis.

In this embodiment, the first track T1 has a first, circular centerline with a first radius, and the second track T2 has a second, circular centerline with a second radius, and the difference between the first and the second radius is equal to the predefined track distance "dt".

In this embodiment, preferably, the first sensor position P1 and to second sensor position P2 are located on a virtual line passing through the rotation axis, this virtual line is preferably parallel to the plane containing the first track and the second track, for example as illustrated in FIG. 15(a).

In an embodiment, the magnetic source is rotatable about a rotation axis; and the first track and the second track are cylindrical tracks about said rotation axis and spaced apart along said rotation axis; and the first track (T1) has a first outer radius (R1), and the second track (T2) has a second outer radius (R2) equal to the first outer radius.

In this embodiment, preferably, the first sensor position and to second sensor position are located on a virtual line parallel to the rotation axis, for example as illustrated in FIG. 14(b).

In an embodiment, the first number (N1) of pole pairs is a value in the range from 4 to 15; and the second number (N2) of pole pairs is a value in the range from 5 to 16.

In an embodiment, the first number (N1) of pole pairs is a value in the range from 4 to 7, and the second number (N2) of pole pairs is a value in the range from 5 to 8.

In an embodiment, the position sensor system is a linear position sensor system; and the first track is the first linear segment, and the second track is a second linear segment parallel to the first linear segment.

In this embodiment, preferably the first sensor position and to second sensor position are located on a virtual line perpendicular to the first and second linear segments, for example as illustrated in FIG. 15(c).

In an embodiment, the processing unit is configured for: b) estimating a transverse position of the sensor device relative to the magnetic tracks, based on at least some of the measured magnetic field components; and c) for determining the position of the sensor device based on at least some of the measured magnetic field components and based on the estimate transverse position.

The "transverse position" is a radial position in the example of FIG. 15(a) or FIG. 15(b) and is a lateral position in the example of FIG. 15(c). Such a method is illustrated e.g. in FIG. 11.

In an embodiment, the processing unit is configured for: b) calculating a first set of quadrature components and a second set of quadrature components based on at least some of the measured components using a predefined set of coefficients; and c) for determining the position of the sensor device based on the first and second set of quadrature components.

Step b) may comprise calculating each of said quadrature components as a weighted sum of only two of the measured magnetic field components, for example as illustrated in FIG. 4. Thus, in this embodiment, only two weighting factors are required for each quadrature component, i.e. a total of only eight coefficients.

It is an advantage of this embodiment that the set of coefficients is predetermined, for example stored in non-volatile memory before actual use of the sensor device.

In an embodiment, the sensor device comprises a non-volatile memory, and the set of coefficients are stored in said non-volatile memory.

The coefficients may be determined by performing a calibration test after mounting of the sensor device relative to the magnet and determining an optimal set of coefficients based on the measurements performed during the calibration test. This may considerably relax the mounting tolerances, and/or improve the accuracy of the position sensor system.

In an embodiment, the number of coefficients is at most eight.

In an embodiment, the processing unit is configured for: b) estimating a transverse position of the sensor device relative to the magnetic tracks, based on at least some of the measured components, and for determining a set of coefficients based on the estimated transverse position; and c) for calculating a first set of quadrature components and a second set of quadrature components based on at least some of the measured components, using the set of coefficients determined in step b); d) determining the position of the sensor device based on the first and second set of quadrature components.

It is an advantage of this embodiment that the set of coefficients is dynamically determined or dynamically adjusted as a function of the transverse position, e.g. caused by mechanical mounting tolerances or by mechanical drift or wear. In this way, the accuracy of the absolute position can be improved. This dynamic recalibration may be performed by the sensor device itself, for example periodically, and/or may be initiated for example by an external processor.

In an embodiment, the transverse position of the sensor device is determined based on a ratio of one or more of $|Bx1|/|Bz|$ or $|Bx1|/|By1|$ or $|By1|/|Bz1|$ or $|Bx2|/|Bz2|$ or $|Bx2|/|By2|$ or $|By2|/|Bz2|$ at one or more predefined positions (e.g. estimated using an initial set of coefficients), or may be based on a maximum ratio of of one or more of $|Bx1|/|Bz1|$ or $|Bx1|/|By1|$ or $|By1|/|Bz1|$ or $|Bx2|/|Bz2|$ or $|Bx2|/|By2|$ or $|By2|/|Bz2|$ at a random position over a full rotation, or may be based on the value of the gradient $|dBx/dx|$ at one or more angular positions (e.g. as illustrated in FIG. 16) or in an angular subrange, or may be based on the maximum value of the gradient $|dBx/dx|$ over the measurement range.

According to a second aspect, the present invention also provides a method of determining a position of a sensor device movable along a predefined path relative to a magnetic source or vice versa, the magnetic source comprising a first plurality of magnetic pole pairs arranged along a first track having a first periodicity, and comprising a second plurality of magnetic pole pairs arranged along a second track having a second periodicity different from the first periodicity, wherein centrelines of the tracks are spaced apart by a predefined track distance, the method comprising the steps of: a) measuring at least two orthogonal magnetic field components (e.g. By1, Bz1) at a first sensor location, and measuring at least two orthogonal magnetic field components (e.g. By2, Bz2) at a second sensor location, spaced from the first sensor location by a predefined sensor distance smaller than the predefined track distance in a direction transverse to the tracks (e.g. substantially perpendicular to the tracks); b) determining the position of the sensor device based on at least some of the measured magnetic field components.

In an embodiment, one of the measured magnetic field components is tangential to the direction of relative movement (typically indicated as "By" in this application).

In an embodiment, step a) comprises: measuring at least two (e.g. By1, Bz1) or at least three (e.g. Bx1, By1, Bz1) orthogonal magnetic field components at a first sensor location, and measuring at least two (e.g. By2, Bz2) or at least three (e.g. Bx2, By2, Bz2) orthogonal magnetic field components at a second sensor location, spaced from the first sensor location by a predefined sensor distance smaller than the predefined track distance in a direction transverse to the tracks (e.g. substantially perpendicular to the tracks); and wherein step b) comprises: i) estimating a transverse position (e.g. offset) of the sensor device relative to the tracks based on at least some of the measured magnetic field components; ii) determining the position of the sensor device based on at least some of the measured magnetic field components and based on the estimated transverse position.

In an embodiment, step b) comprises: i) calculating a first set of quadrature components and a second set of quadrature components based on at least some of the measured magnetic field components using a set of equations with a predefined set of coefficients; ii) determining the position of the sensor device based on the first and second set of quadrature components.

In an embodiment, the set of equations comprises or consists of four equations.

In an embodiment, the set of equations comprises or consists of four polynomial equations.

In an embodiment, the set of equations comprises or consists of four linear equations.

In an embodiment, the set of equations comprises or consists of four linear equations, each with only two terms and two coefficients (or weighting factors).

According to another aspect, the present invention is also directed to a position sensor device, configured for performing any of the methods of FIG. 11 or FIG. 13 or FIG. 14, or variants thereof using magnetic field gradients, as described in the detailed description.

Particular and preferred aspects of the present invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 2(a) also shows a second orthogonal coordinate system connected to the sensor device, and containing axes X, Y, Z. As can be seen, A is parallel to Z, T is parallel to Y, and R is parallel to X.

FIG. 4 shows a set of equations that may be used in certain embodiments of the present invention to convert measured magnetic field components into two sets of quadrature components.

FIG. 8(a) shows a schematic representation of a sensor device comprising two magnetic sensors structures spaced apart over a predefined distance Ax, each sensor structure comprising four horizontal Hall elements arranged near the periphery of an integrated magnetic flux concentrator (IMC). Each sensor structure is capable of measuring three orthogonal components Bx, By, Bz.

FIG. 8(b) shows another sensor device comprising two magnetic sensors structures spaced apart over a predefined distance Ax, each sensor structure comprising one horizontal Hall element (for measuring Bz) and two vertical Hall elements (for measuring Bx and By respectively).

FIG. 8(c) shows another sensor device comprising two magnetic sensors structures spaced apart over a predefined distance Ax, each sensor structure comprising only two horizontal Hall elements arranged on opposite sides of an IMC disk and located on a virtual line perpendicular to the X-axis. Each sensor structure is capable of measuring two orthogonal components By, Bz.

FIG. 8(d) shows another sensor device comprising two magnetic sensors structures spaced apart over a predefined distance Ax, each sensor structure comprising one horizontal Hall element and one vertical Hall element. Each sensor structure is capable of measuring two orthogonal components By, Bz.

FIG. 8(e) to FIG. 8(h) show variants of the sensor devices of FIG. 8(a) to FIG. 8(d) respectively, each comprising four sensor structures spaced apart in the X and in the Y-direction.

FIG. 15(a) shows an angular position sensor system comprising a magnetic source comprising two concentric tracks located in a single plane, and a sensor device arranged above or below that plane.

FIG. 15(b) shows an angular position sensor system comprising a magnetic source comprising two circular tracks arranged on a cylindrical surface, and a sensor device arranged as a satellite around that cylinder.

FIG. 15(c) shows a linear position sensor system comprising a magnetic source comprising two linear parallel tracks located in a single plane, and a sensor device arranged above that plane. Also shown is an orthogonal coordinate system connected to the magnetic source, comprising an axial direction A, a longitudinal direction L, and a transverse direction T.

Figure 1A:
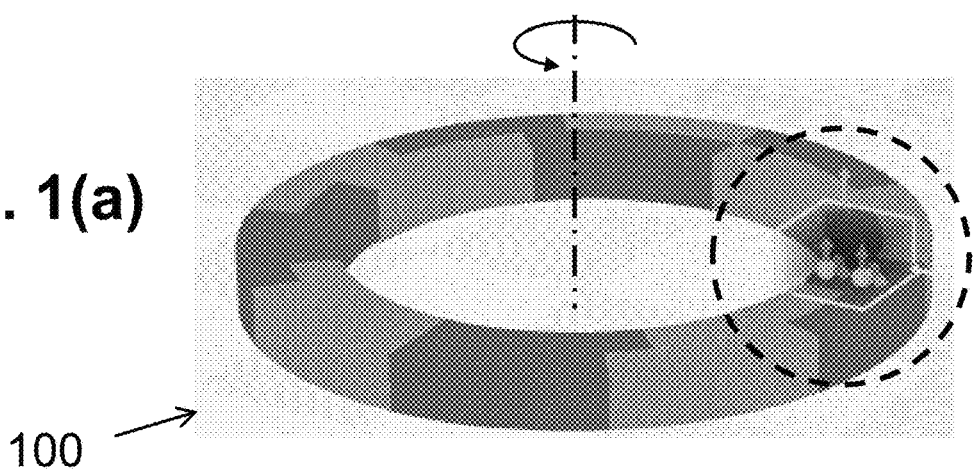
FIG. 1(a) shows a conceptual perspective view of an angular position sensor system according to an embodiment of the present invention, showing a magnetic source with at least two tracks comprising a plurality of poles, and a sensor device capable of measuring two or three orthogonal field components at two sensor locations.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 15A:
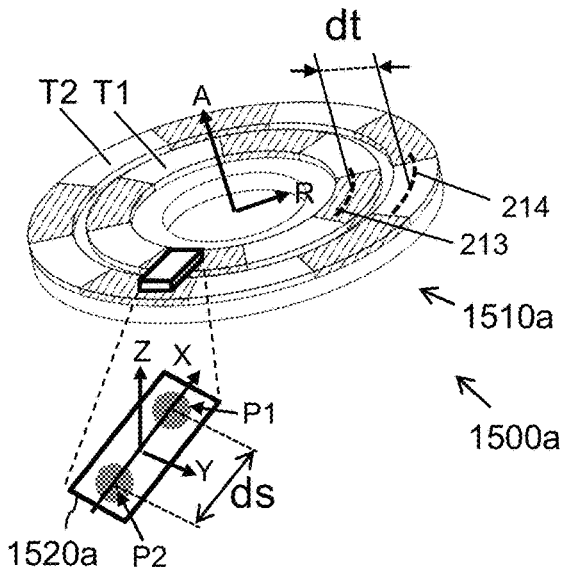
FIG. 15(a) to FIG. 15(c) illustrate embodiments of position sensor systems as proposed by the present invention, in perspective view.
Figure 15B:
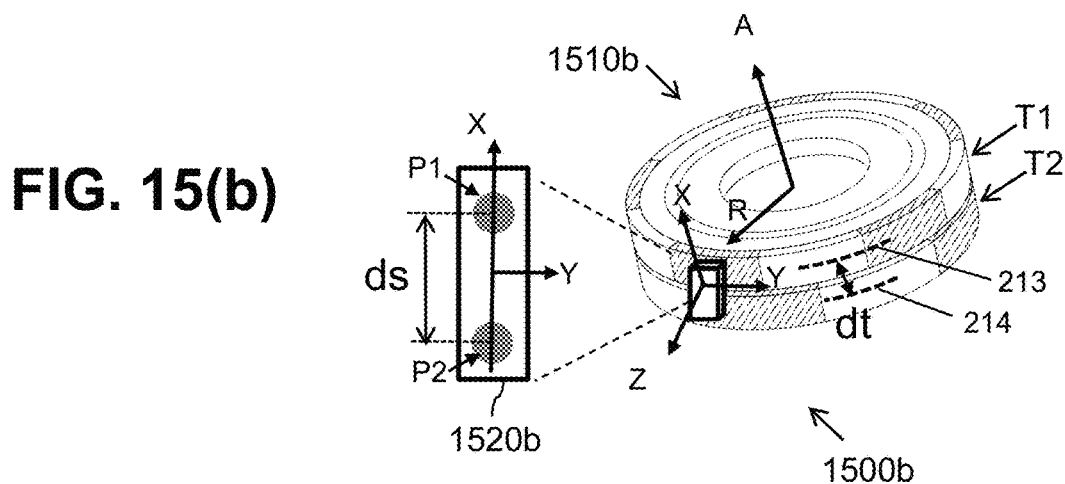
Figure 15C:
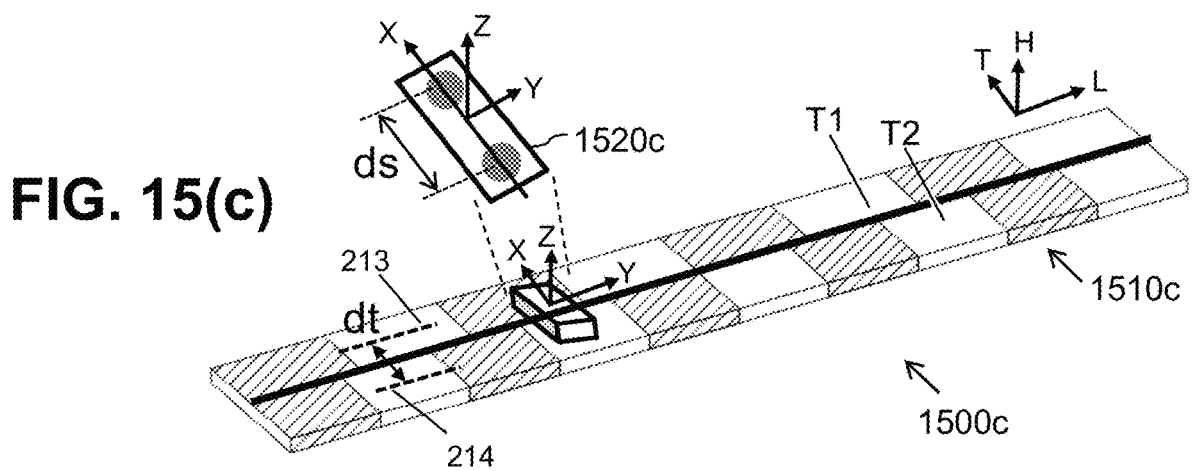

The term "track" as part of a magnetic source, as used herein, typically refers to a ring-shaped or annular shaped or cylindrical shaped object when talking about an angular position sensor system for example as illustrated in FIG. 15(a) and FIG. 15(b), and typically refers to a beam-shaped object when talking about a linear position sensor system, for example as illustrated in FIG. 15(c).

The tracks of the magnetic source of FIG. 15(a), FIG. 15(b) and FIG. 15(c) have a "width" extending in the radial direction R, the axial direction A, and the transverse direction T, respectively.

The term "centreline of a track" as used herein refers to a virtual line or curve, situated at the surface of the track, in the middle of the width. For example, in FIG. 15(a) the centreline is a circle having a radius equal to the average of the inner radius and the outer radius of the respective track; in FIG. 15(b) the centreline is a circle having a radius equal to the outer radius of the track and situated halfway the width (in the axial direction); in FIG. 15(c) the centreline is line in the middle of the track (halfway the transverse direction).

Figure 1B:
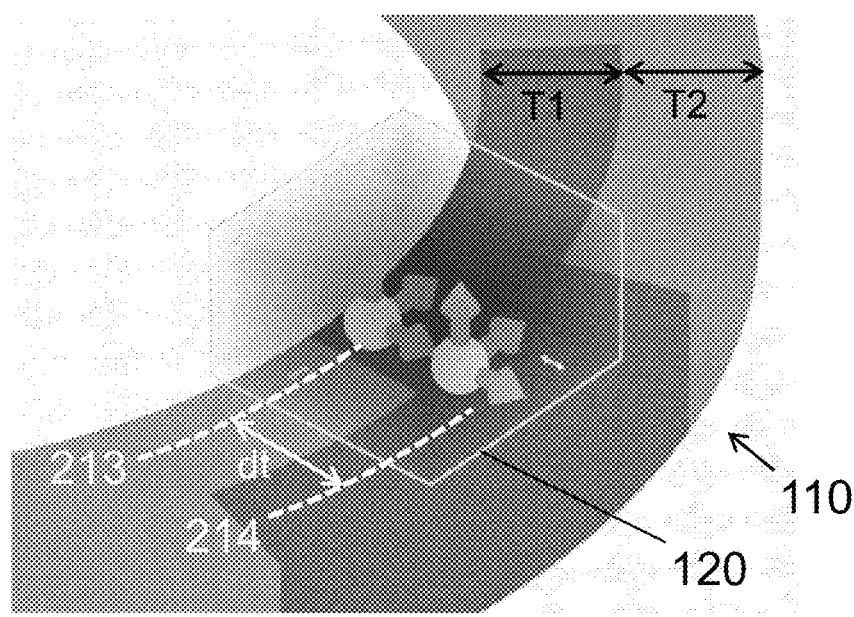
FIG. 1(b) shows an enlarged view of a portion of FIG. 1(a), furthermore showing a centreline of the first track and of the second track, spaced apart by a predefined track distance.
Figure 1C:
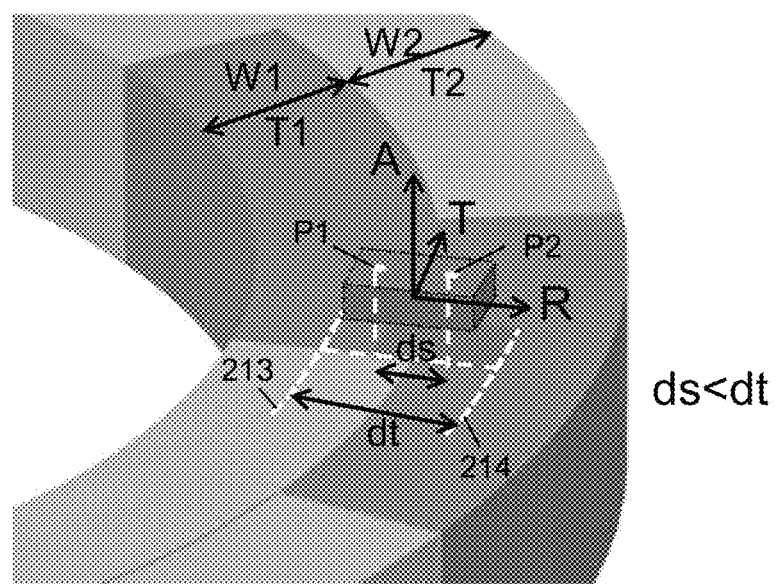
FIG. 1(c) shows in more detail the relative position of the sensor device of FIG. 1(b) relative to the two tracks. The drawing also shows a radial direction R, a tangential direction T and an axial direction A with respect to the magnetic source.

The expression "the tracks are spaced apart by a distance dt" as used herein means that centrelines of the tracks are spaced by the distance "dt", for example as illustrated in FIG. 1(c).

The expression "the sensors or sensor structures are spaced apart by a distance ds" as used herein means that centres (or a reference point) of the sensors or sensor structures are spaced apart by the distance "ds", for example as illustrated in FIG. 1(c).

The present invention relates to linear and angular position sensor systems, linear and angular position sensor devices, and methods of determining a linear or an angular position relative to a magnetic source, and in particular to position sensor systems with high accuracy.

The present invention provides a position sensor system comprising a magnetic source, and a sensor device which is movable along a predefined path relative to the magnetic source. The magnetic source comprises a first plurality (N1) of magnetic pole pairs arranged along a first track having a first periodicity, and comprises a second plurality (N2) of magnetic pole pairs arranged along a second track having a second periodicity different from the first periodicity. A centreline (or central line or central curve) of the first track is spaced from a centreline (or central line or central curve) of the second track by a predefined track distance "dt". The sensor device comprises at least four magnetic sensitive elements configured for measuring at least two first orthogonal magnetic field components (typically referred to herein as: By1, Bz1) at a first sensor location (P1), and at least two second orthogonal magnetic field components (typically referred to herein as: By2, Bz2) at a second sensor location (P2). The first sensor location (P1) is spaced from the second sensor location (P2) by a predefined sensor distance "ds". The sensor device further comprises a processing unit configured for determining said linear or angular position based on at least a subset of the measured signals (e.g. based on, or based solely on By1, Bz1, By2, Bz2).

According to an important aspect of the present invention, the predefined sensor distance "ds" is smaller than the predefined track distance "dt", measured in a direction transverse to the tracks.

It is a major advantage of this system that the dimensions of the sensor device, in particular the distance between the sensor elements can be chosen independent of the distance between the tracks of the magnetic source. This makes it possible (inter alia) to optimise the magnetic sensor device and the magnetic source independent from each other, and also allows a single sensor device to be used in combination with various magnetic sources.

It is a major advantage of the system that the distance "ds" between the sensor elements is smaller (e.g. at least 20% smaller) than the distance "dt" between centrelines of the tracks of the magnetic source, because this allows the size and the costs of the semiconductor substrate of the sensor device to be reduced. This is especially important in a highly competitive market.

It is an advantage of this system wherein the magnetic source comprises a first track with the first periodicity and a second track with the second periodicity, instead of only a single track with multiple periodicities, because the former magnetic source is easier to produce. For example, if the first and second tracks are linear tracks (e.g. as illustrated in FIG. 15(c)), the magnetic source may be composed of two magnetic strips, each of which may be produced separately, and then arranged side by side in the plane (e.g. as illustrated in FIG. 15(a). As another example, if the first and second tracks are circular tracks having a same radius but a different number of poles (e.g. as illustrated in FIG. 15(b), the magnetic source may be composed of two magnetic rings which may be produced separately, and then arranged side-by-side axially. As another example, if the first and second tracks are circular tracks having a different radius and a different number of poles (e.g. as illustrated in FIG. 15(a), the magnetic source can be composed of two magnetic rings which may be produced separately, and then arranged concentrically, in a plane.

Examples of such position sensor systems are shown in FIG. 15(a) to FIG. 15(c).

More specifically, FIG. 15(a) shows an angular position sensor system 1500a comprising a magnetic source 1510a comprising two concentric tracks T1, T2 located in a single plane, and a sensor device 1520a arranged above or below that plane.

FIG. 15(b) shows an angular position sensor system 1500b comprising a magnetic source 1510b comprising two circular tracks T1, T2 arranged on a cylindrical surface, and a sensor device 1520b arranged as a satellite around that cylindrical surface.

FIG. 15(c) shows a linear position sensor system 1500c comprising a magnetic source 1510c comprising two linear parallel tracks T1, T2 located in a single plane, and a sensor device 1520c arranged above that plane.

As mentioned above, the number of magnetic pole pairs N1 of the first track T1 is different from the number of magnetic pole pairs of the second track. In certain embodiments, the ratio of the first number of pole pairs (N1) and the second number of pole pairs (N2) is (N−1)/N, where N is an integer number in the range from 5 to 32, preferably in the range from 5 to 16, for example N1=4 and N2=5 (ratio=4/5), or N1=5 and N2=6 (ratio=5/6), or N1=6 and N2=7 (ratio=6/7), etc.

In an embodiment, a ratio of the first number of pole pairs (N1) and the second number of pole pairs (N2) is (N-2)/N, where N is an odd integer number in the range from 5 to 31, preferably in the range from 5 to 17, for example N1=5 and N2=7 (ratio=5/7), or N1=7 and N2=9 (ratio=7/9), or N1=9 and N2=11 (ratio=9/11), or N1=11 and N2=13 (ratio=11/13), or N1=13 and N2=15 (ratio=13/15), or N1=15 and N1=17 (ratio=15/17), or N1=17 and N2=19 (ratio=17/19), or N1=19 and N2=21 (ratio=19/21), or N1=21 and N2=23 (ratio=21/23), or N1=23 and N2=25 (ratio=23/25), or N1=25 and N2=27 (ratio=25/27), or N1=27 and N2=29 (ratio=27/29), or N1=29 and N2=31 (ratio=29/31).

As will be explained in more detail further, by measuring two orthogonal magnetic field components at the first and at the second sensor location P1, P2, it is possible to determine a unique position relative to the magnetic source, with high accuracy.

The invention will mainly be explained referring to the angular position sensor system shown in FIG. 15(a) for simplifying the description, but the present invention is not limited thereto, and the same principles also apply to other variants, mutatis mutandis.

Referring now to the figures.

FIG. 1(a) to FIG. 1(c) show a conceptual view of an angular position sensor system 100 corresponding to that of FIG. 15(a). In the specific example shown, the magnetic source 110 comprises two magnetic rings: an inner ring having N1=8 pole pairs, and an outer ring having N2=10 pole pairs, but the present invention is not limited thereto, and the rings may comprise another number of magnetic pole pairs. The rings may be axially magnetised. The example also shows a sensor device 120 capable of measuring two or three orthogonal magnetic field components in each of two sensor locations P1, P2, for example an axial field component in a direction A which is parallel to the rotation axis, a radial field component oriented in the radial direction R, and a tangential field component oriented in a circumferential direction T, tangential to a virtual circle.

FIG. 1(b) shows an enlarged view of a portion of FIG. 1(a) and shows that the first magnetic track T1 is a ring with a first inner and outer radius, and the second magnetic track T2 is a ring with a second inner and outer radius. The first track T1 has a first width W1, and the second track T2 as a second width W2. In the example shown, the first width W1 and the second width W2 are equal, but that is not absolutely required for the invention to work, and the invention will also work if the width W1 of the first track T1 is larger or smaller than the second width W2 of the second track T2.

FIG. 1(c) is a perspective view illustrating the relative position of the sensor device 120 having two sensor positions P1, P2 relative to the magnetic tracks T1, T2. As shown, a projection of the first and the second sensor position P1, P2 on a plane containing the first and the second centreline 213, 214 are preferably located on a line segment which is oriented radially.

Contrary to what developers would normally choose, the inventors decided not to locate the first and second sensor position above the centrelines 213, 214, i.e. above the middle of the tracks T1 and T2, but they decided to move the sensor locations closer together. Indeed, as can be seen, the distance "ds" between the projections of the first and second sensor position P1, P2 is smaller than the distance "dt" between the centrelines 213, 214 of the tracks. It could not be predicted beforehand whether this solution would work at all, let alone how well the solution would work.

While not shown FIG. 1(c), there may be a code-free region between the first track T1 and the second track T2. This region may for example be formed by a groove. This groove may be left open, or may be filled with a non-magnetic material, e.g. a plastic, a ceramic, a non-magnetic metal or alloy (e.g. to avoid accumulation of dust or particles). Even if a code-free region is present, the two sensor positions P1, P2 are preferably located "above" the magnetic material, i.e. above the magnetized zones, e.g. as illustrated in more detail in FIG. 2(d).

While the representation of FIG. 1(c) seems to suggest that the sensor device contains a substrate and that the two sensor positions have to be located at the top of that substrate, this is not absolutely required, and the sensor locations P1, P2 may also be located underneath the substrate, as may be obtained by turning the sensor device upside-down. In this way, the sensor elements can be closer to the tracks, the measured signals can be larger, the signal-to-noise ratio (SNR) may be increased and/or crosstalk may be reduced, and the overall accuracy may be improved.

Figure 2A:
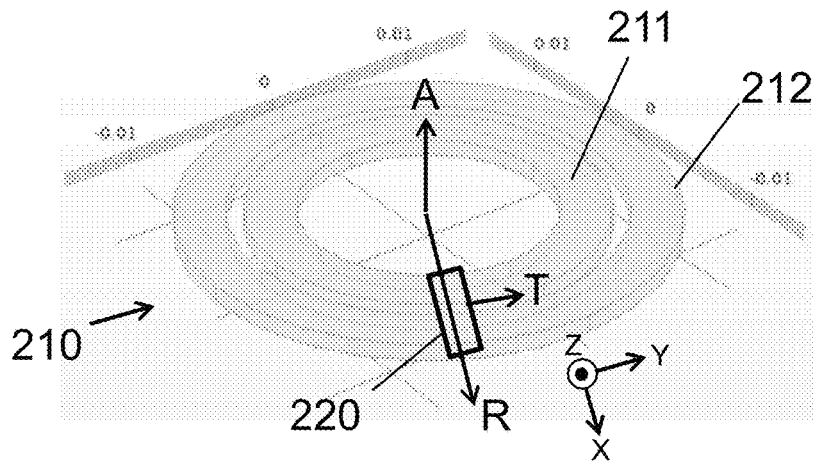
FIG. 2(a) shows a mathematical model of the magnetic source, which was used in a computer simulation. In the example shown, the magnetic source comprises two concentric rings located in a single plane. The drawing also shows a radial direction R, a tangential direction T and an axial direction A with respect to the magnetic source.

FIG. 2(a) shows a mathematical model of a variant of the magnetic source 110 of FIG. 1(a), comprising an inner ring comprising or consisting of a magnetic material and an outer ring comprising or consisting of magnetic material, spaced apart from each other by a non-magnetic material (e.g. by air).

In the specific example shown in FIG. 2(a), the inner ring 211 is made of or comprises a magnetic material having an inner radius of 7.5 mm and an outer radius of 10.5 mm, hence has a width W1 of 3.0 mm. The outer ring 212 is made of or comprises a magnetic material having an inner radius of 11.5 mm and an outer radius of 14.5 mm, and a width W2 of 3.0 mm. In the example, both rings have a height (in the axial direction) of 1.0 mm. But of course, this is only an example, and embodiments of the present invention are not limited to these specific dimensions.

FIG. 2(a) also shows the relative position and orientation of the sensor device 220 with respect to the magnetic source 210. This figure also shows a first coordinate system relative to the magnetic source comprising the axes A (axial direction), R (radial direction), T (tangential direction), and a second coordinate system connected to the sensor device 220, having an X-axis corresponding to the radial direction R, a Y-axis corresponding to the direction of relative movement, in this example the circumferential direction T, and a Z-axis, parallel to the rotation axis A. The sensor device 220 preferably comprises a semiconductor substrate, and the X and Y axis are parallel to the semiconductor substrate, and the Z-axis is orthogonal to the semiconductor substrate.

This model was used in a computer simulation, the results of which are described further.

Figure 2B:
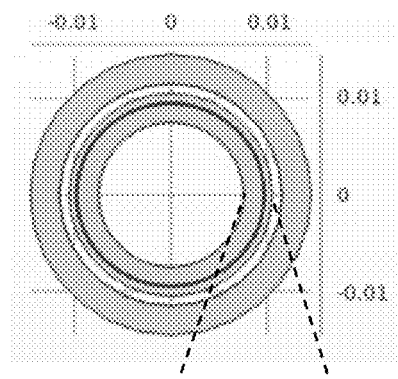
FIG. 2(b) is a top view showing an orthogonal projection of possible locations of the first sensor element above the inner ring (or inner track) of the magnetic source.
Figure 2C:
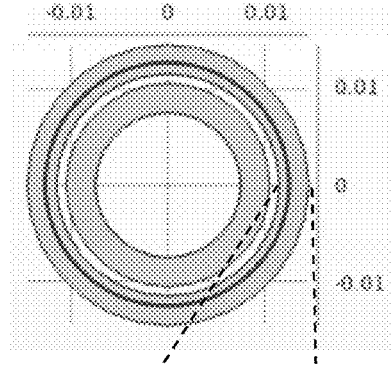
FIG. 2(c) is a top view showing an orthogonal projection of possible locations of the second sensor element above the outer ring (or outer track) of the magnetic source.

FIG. 2(b) is a top view showing orthogonal projections of the relative locations of the first sensor positions P1 on the inner ring 211 of the magnetic source, and FIG. 2(c) is a top view showing orthogonal projections of the relative locations of the second sensor positions P2 on the outer ring 212 of the magnetic source. As can be seen, these positions are not located on the centrelines (in the middle) of the rings but are deliberately off-center. In the particular example shown, the two sensor positions are spaced apart by ds=1.9 mm, and the first sensor positions P1 are located at a radius of 11.0−0.95=10.05 mm, and the second sensor positions P2 are located at the radius of 11.0+0.95=11.95 mm, but of course the present invention is not limited to this example, and other sensor positions may also be used. In fact, it is not required that the distance between P1 and the first centreline is substantially equal to the distance between P2 and the second centreline, but in preferred embodiments that is the case.

Figure 2D:
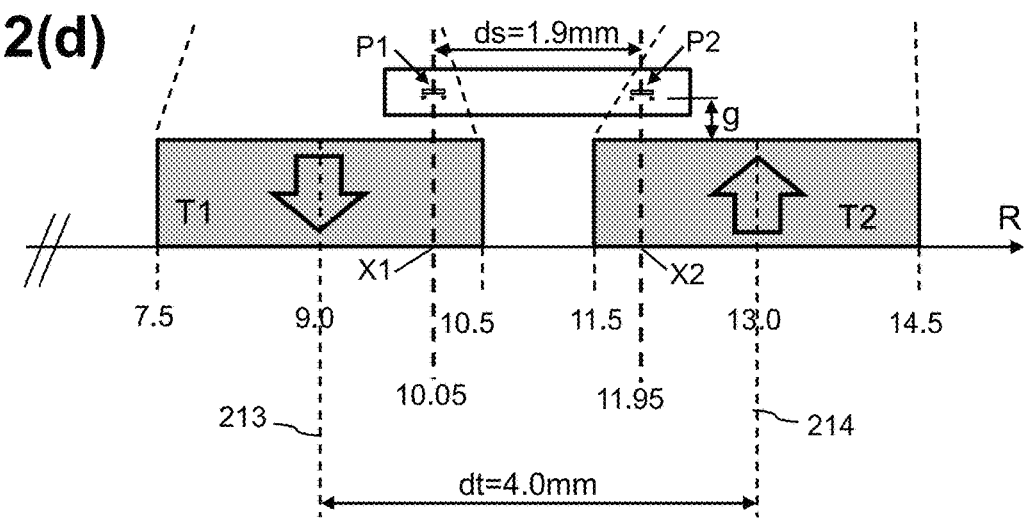
FIG. 2(d) shows an enlarged cross-sectional view of the two tracks and the two sensor locations shown in the example of FIG. 2(a), in a plane containing the axes A and R. As can be seen, the first sensor position is located above the inner ring, and the second sensor position is located above the outer ring, and both sensor positions are located between the centrelines of the inner and outer ring. The specific values provided are of course only an example.

FIG. 2(d) shows an enlarged cross-sectional view in a plane perpendicular to the plane in which the magnetic rings are located and passing through the first and the second sensor location P1, P2. As shown, the first sensor position P1 is preferably located "vertically above" the inner ring 211, and the second sensor position P2 is preferably located "vertically above" the outer ring 212, although this is not absolutely required, and the invention may still work if one or both of the sensor positions P1, P2 is located "vertically above" the non-coded region, an example of which will be discussed in relation to FIG. 7(a) and FIG. 7(b). As can also be seen, projections of the first and second sensor location P1, P2 (at 10.05 and 11.95 mm) are located between the centreline 213 of the inner ring (at 9.0 mm) and the centreline 214 of the outer ring (at 13.0 mm). It is noted that the sensor locations of this embodiment are in fact offset quite far from the centrelines (1.05 mm/1.50 mm=70%).

The sensor device of FIG. 2(d) may comprise at each sensor location two or four horizontal Hall elements and a magnetic flux concentrator (IMC), for example as shown in more detail in FIG. 8(a) to FIG. 8(d), but other sensor structures may also be used. Such an IMC disk may have a diameter of about 0.15 to about 0.25 mm. The sensor device may be arranged at a small axial distance from the magnetic rings, e.g. at a distance "g" in the range from 0.3 to 2.5 m, or in the range from 0.4 mm to 2.5 mm, or from 0.5 to 2.0 mm, or from 0.5 to 1.5 mm.

Figure 3A:
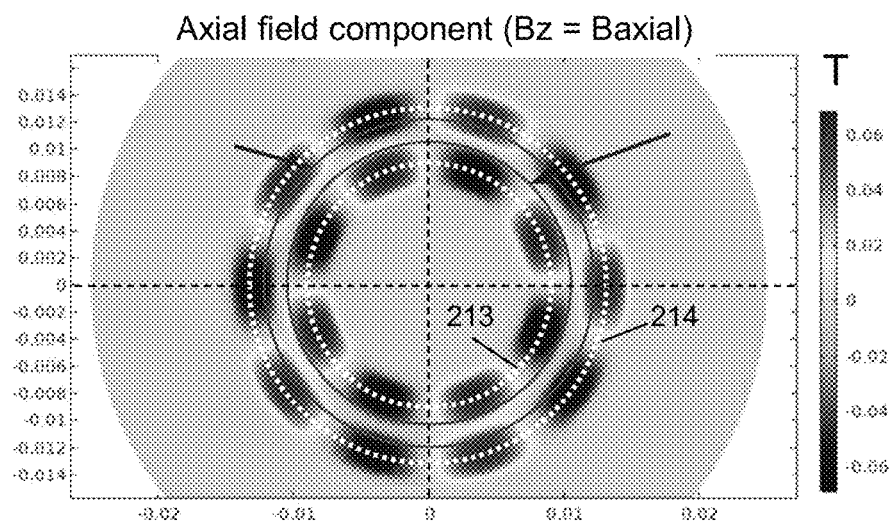
FIG. 3(a) is a graph obtained by computer-simulation, showing the amplitude of the magnetic field component Bz oriented in the axial direction of an exemplary magnetic source having ten pole pairs on its outer ring, and having eight pole pairs on its inner ring.

FIG. 3(a) is a graph obtained by a computer-simulation, showing the amplitude of the magnetic field component Bz (=Baxial) as would be measured by the sensor device 220 of FIG. 2(a), located about 1 mm above the rings. The component Bz is oriented in the axial direction of the magnetic source having ten pole pairs on its outer ring 212 and having eight pole pairs on its inner ring 211, which are clearly visible. The centreline 213 of the inner ring (or magnetic track) 211, and the centreline 214 of the outer ring (or magnetic track) 212 are indicated as white dotted circles. The projected positions of the first and second sensor elements P1, P2 are indicated by means of black circles situated between the dotted centrelines. As was to be expected, the signal Bz is largest above the respective centrelines 213, 214, but degrades fast with increasing distance from these centrelines.

Figure 3B:
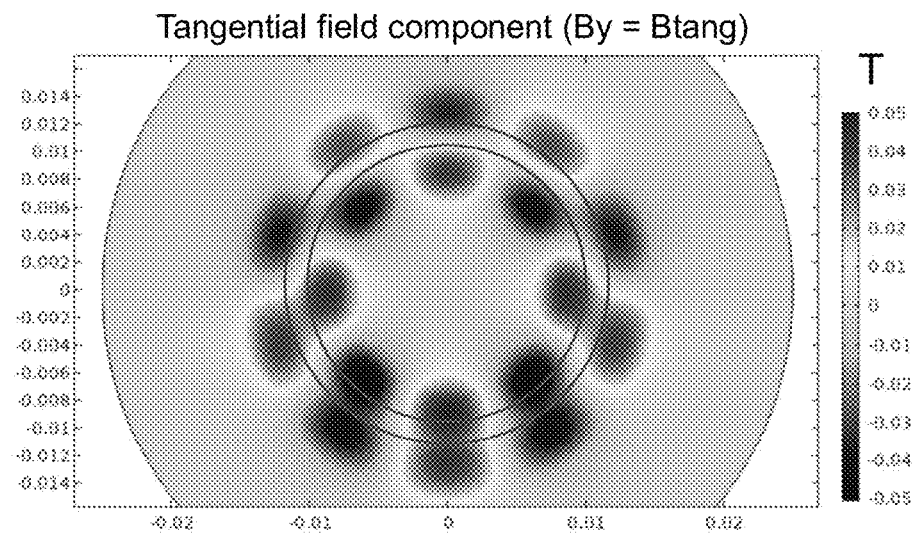
FIG. 3(b) is a graph obtained by computer-simulation, showing the amplitude of the magnetic field component By oriented in the circumferential direction, tangential to the direction of relative movement.

FIG. 3(b) is a graph obtained by computer-simulation, showing the amplitude of the magnetic field component By (=Btang) tangential to the direction of relative movement, i.e. oriented in the circumferential direction. As can be seen, there is considerable overlap (or crosstalk) between the magnetic field generated by the inner ring and the outer ring.

Figure 3C:
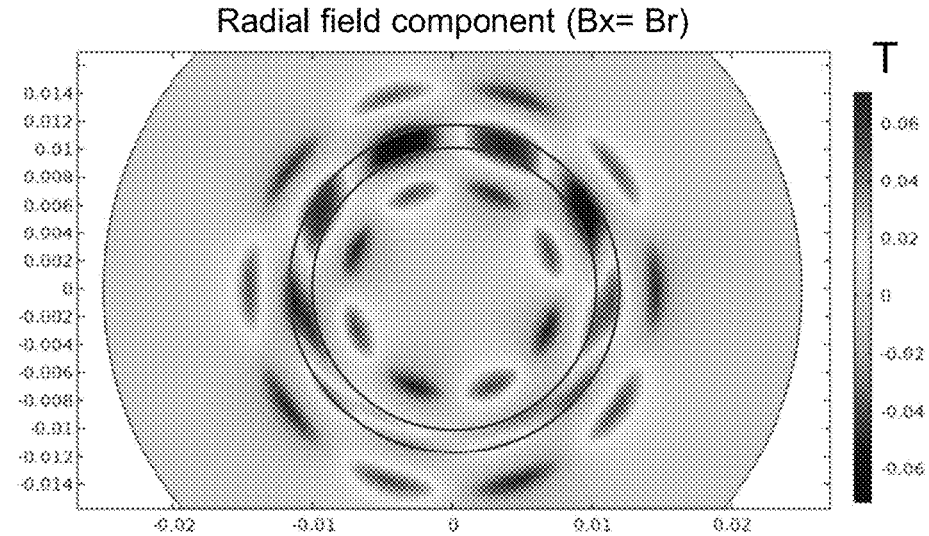
FIG. 3(c) is a graph obtained by computer-simulation, showing the amplitude of the magnetic field component Bx oriented in the radial direction, perpendicular to the direction of relative movement.

FIG. 3(c) is a graph obtained by computer-simulation, showing the amplitude of the magnetic field component Bx (=Bradial) oriented in a radial direction of the magnetic source, perpendicular to the direction of relative movement. Again, there is large overlap or crosstalk between the magnetic field created by the inner ring and the magnetic field created by the outer ring.

The reader will agree that it is impossible to predict whether a position sensor system where the sensor elements are located offset from the centrelines, will still work, let alone to predict or even estimate how good or how bad the performance will be. The zones indicated by 390 and 391 will be described further.

Anyway, while not the only solution, the inventors came to the idea of using a linear transformation to convert the measured signals (in particular By and Bz measured at the two sensor locations P1, P2) into two sets of quadrature signals.

FIG. 4 shows a set of linear equations that can be used in embodiments of the present invention to convert at least some of the measured signals of the magnetic field components, in particular Bz (=Baxial) and By (=Btang) into two sets of quadrature components, one set being represented by (Bsin1, Bcos1) and the other set being represented by (Bsin2, Bcos2). From these sets, two angles can then be calculated, for example in accordance with the following formulas: a1=arctan(Bsin1/Bcos1) and a2=arctan(Bsin2/Bcos2).

The first angle a1 is indicative of an angular position of the inner ring (in the example having a periodicity of 360°/4=90°, hence having an ambiguity of integer multiples of 90°). and the second angle a2 is indicative of an angular position of the outer ring (in the example having a periodicity of 360°/5=72°, thus having an ambiguity of integer multiples of 72°). The combination of the two angles (α1, α2), however, corresponds to a unique angular position of the sensor device relative to the magnetic source.

The set of equations of FIG. 4 contain eight coefficients. Suitable or optimal coefficients values a1, a2, b1, b2, c1, c2, d1, d2 can be found by simulations, or by measurement, and by using known techniques, such as curve-fitting techniques and/or least mean square error techniques. It is also possible to optimize the coefficients values for each particular assembly, e.g. by performing measurements of a particular system during a calibration test after assembly, and by optimizing the parameters for that assembly, but of course that is more difficult and more expensive. It would be more desirable if one could work with a single set of predefined coefficients. The sensor device may comprise a non-volatile memory 921 (see FIG. 9), and the coefficients values may be stored in the non-volatile memory as parameters.

Experiments were performed to find out how good or how bad the resulting position would be, in terms of accuracy.

Figure 5A:
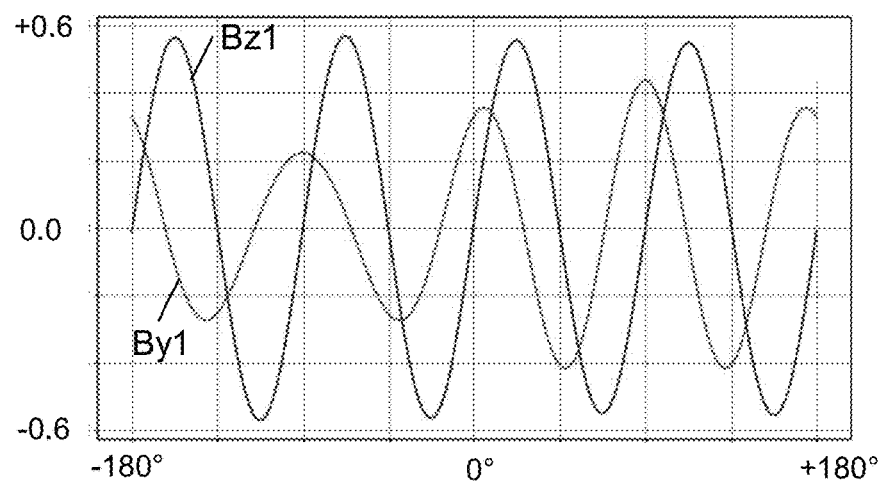
FIG. 5(a) shows a graph with waveforms of two orthogonal magnetic field components By1, Bz1, as can be measured at the first sensor location. The amplitude is shown in arbitrary units as a function of the mechanical position of the sensor device. As can be seen, these measured signals have a periodicity of 360°/4=90°.

FIG. 5(a) shows a graph with waveforms of two orthogonal magnetic field components Bz1, By1, as can be measured at first sensor locations P1, in the vicinity of the first track T1, more in particular "vertically above" the inner track T1, e.g. as shown in FIG. 2(d). The amplitude (vertical axis) is shown in arbitrary units as a function of the mechanical position (horizontal axis) of the sensor device. As can be seen, the signals Bz1, By1 have a periodicity of 360°/4=90°, and the amplitude of Bz1 seems to be fairly constant, but the amplitude of By1 is not constant.

Figure 5B:
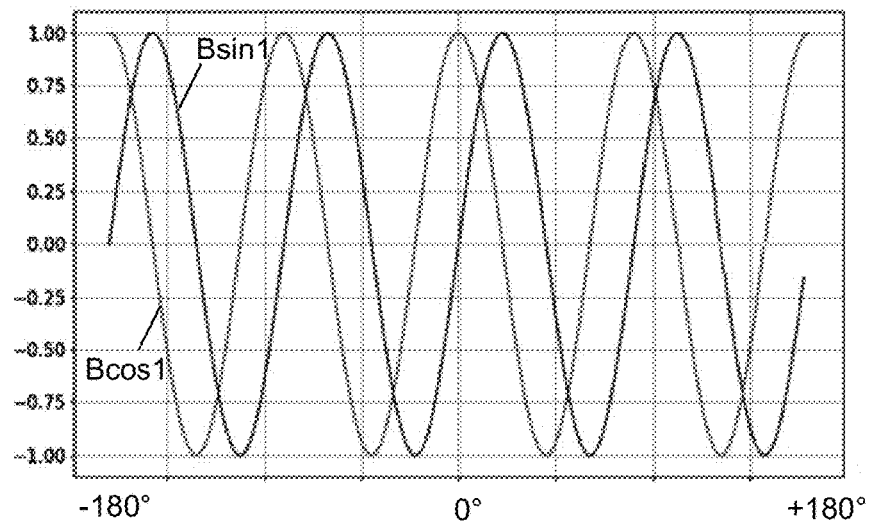
FIG. 5(b) shows a graph with two quadrature waveforms Bsin1, Bcos1 as can be derived from the measured signals By1, Bz1 using a transformation, e.g. using the set of equations shown in FIG. 4.

FIG. 5(b) shows a graph with two quadrature waveforms (Bsin1, Bcos1) as can be obtained by a linear transformation using the set of equations shown in FIG. 4 and suitable coefficients. It is very surprising that the curves of FIG. 5(b) look like a perfect sine and a cosine, especially when considering the amount of crosstalk shown in FIG. 3(b) and FIG. 3(c) and considering that the translation is only a simple set of linear equations. In fact, it is also possible to use higher-order polynomials, e.g. second order or third-order polynomials.

Figure 5C:
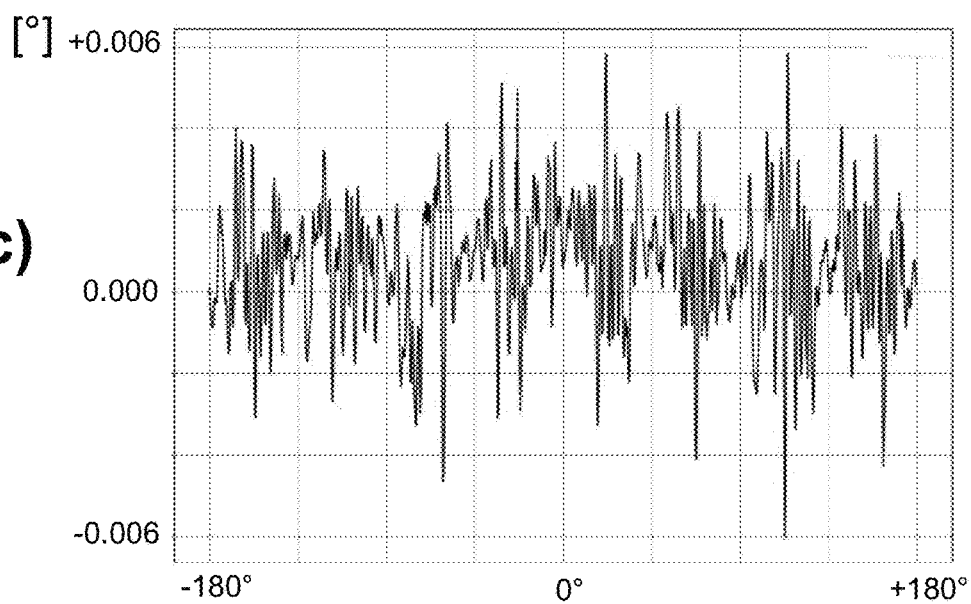
FIG. 5(c) shows a graph illustrating a typical error (in degrees) between a calculated angular position a1 based on the set of quadrature signals shown in FIG. 5(b), and the actual position. The amplitude is shown in degrees as a function of the angular position of the sensor device.

FIG. 5(c) shows a graph illustrating a typical error (in degrees) between the calculated angle a1 based on the sets of quadrature signals (Bsin1, Bcos1) shown in FIG. 5(b), and the actual position. The amplitude is shown in degrees as a function of the angular position of the sensor device. It is simply amazing that the angular position "α1" of the inner ring 211 can be determined with an inaccuracy smaller than ±0.01°, despite the amount of crosstalk.

Similar simulations and calculations were performed for the signals measured at the second sensor location P2, situated near the outer track T2, more in particular "vertically above" the outer track T2, e.g. as shown in FIG. 2(d).

Figure 6A:
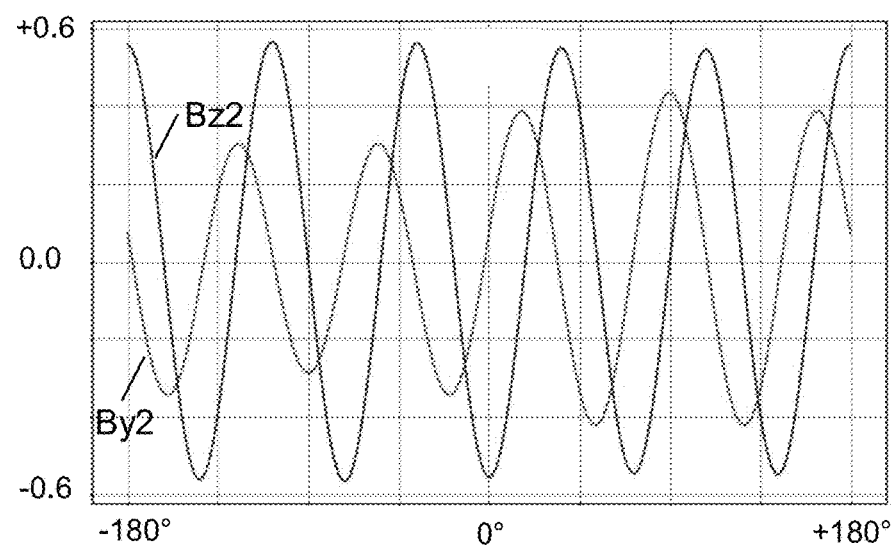
FIG. 6(a) shows a graph with waveforms of two orthogonal magnetic field components By2, Bz2, as can be measured at the second sensor location. The amplitude is shown in arbitrary units as a function of the mechanical position of the sensor device. As can be seen, these measured signals have a periodicity of 360° /5=72° .

FIG. 6(a) shows a graph with waveforms of two orthogonal magnetic field components Bz2, By2, as can be measured at the second sensor location P2. The amplitude (vertical axis) is shown in arbitrary units as a function of the angular position (horizontal axis) of the sensor device 220 relative to the magnet 210. As can be seen, these measured signals have a periodicity of 360°/5=72°.

Figure 6B:
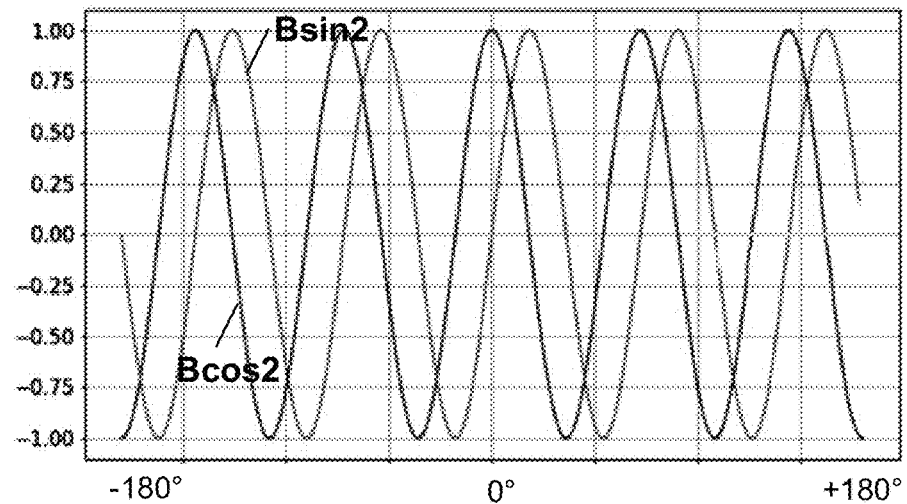
FIG. 6(b) shows a graph with two quadrature waveforms Bsin2, Bcos2 as can be derived from the measured signals By2, Bz2 using a transformation, e.g. using the set of equations shown in FIG. 4.

FIG. 6(b) shows a graph with two quadrature waveforms (Bsin2, Bcos 2) as can be derived from the measured signals (By2, Bz2), e.g. by means of a linear transformation using the set of equations shown in FIG. 4.

Figure 6C:
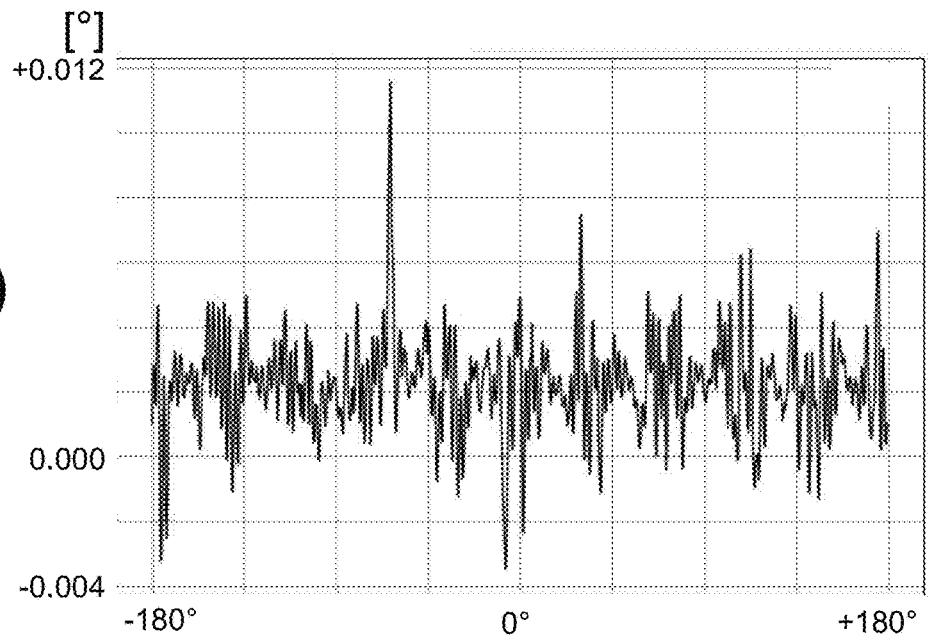
FIG. 6(c) shows a graph illustrating a typical error (in degrees) between a calculated angular position a2 based on the sets of quadrature signals shown in FIG. 6(b), and the actual position. The amplitude is shown in degrees as a function of the angular position of the sensor device.

FIG. 6(c) shows a graph illustrating a typical error (in degrees) between the calculated angle α2 based on the sets of quadrature signals (Bsin2, Bcos2) shown in FIG. 6(b), and the actual angular position of the sensor device 220. The error amplitude (vertical axis) is shown in degrees as a function of the angular position (vertical axis) of the sensor device. Again, it is simply amazing that the angular position "α2" of the outer ring 212 can be determined with an inaccuracy smaller than ±0.02°, despite the considerable amount of crosstalk.

From the simulations of FIG. 5(a) to FIG. 6(c) it can be understood that, since the angular position α1 of the sensor device 220 with respect to the inner ring 211 can be determined with an accuracy better than ±0.01° (but with an ambiguity of multiples of 90°, and since the angular position α2 of the sensor device 220 with respect to the outer ring 212 can be determined with an accuracy better than ±0.02° (but with an ambiguity of multiples of 72°, that the overall angular position of the sensor device 220 relative to the magnetic source containing both rings can be determined with an overall accuracy better than ±0.02° (and without ambiguity). Indeed, the overall angular position can be found e.g. by finding a set of integer values "k1" and "k2" for which (α1+k1)*90°=(α2+)k2*72°), which is equal to the overall angular position, where k1 is an integer value smaller smaller than N1, and k2 is an integer value smaller than N2. Of course, other formulas to calculate the overall position may also be used.

The inventors wanted to know what would happen if the sensor device 220 was built or programmed with the set of coefficients optimized for the envisioned position described above, i.e. for a radial position of P1 at 10.05 mm and a radial position of P2 at 11.95 mm, in case of a mechanical mispositioning of 0.1 mm.

Figure 7A:
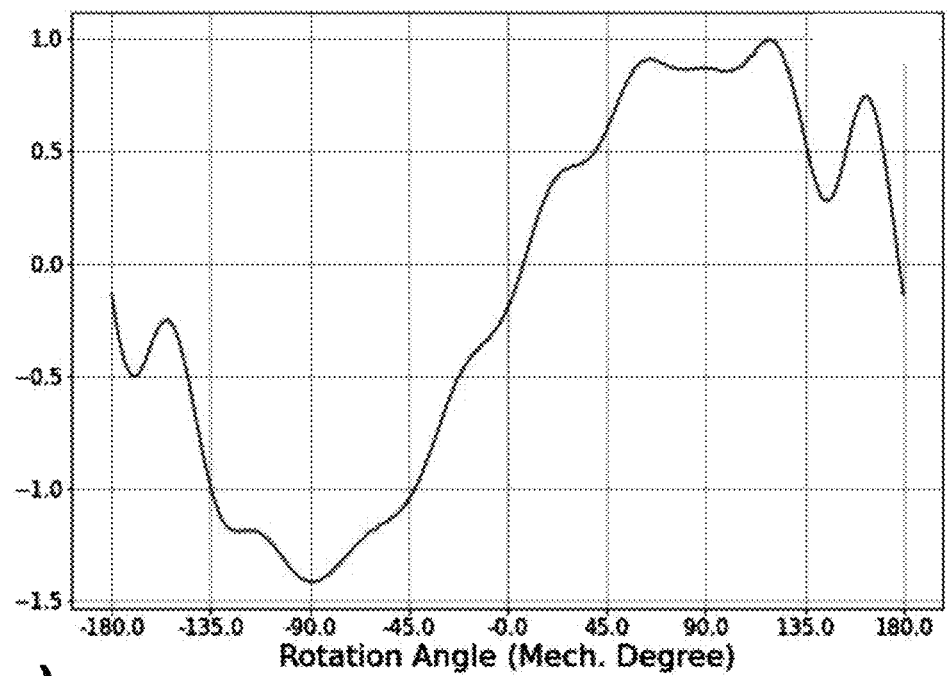
FIG. 7(a) shows a waveform illustrating the angular error between the actual angular position, and an angular position a1 calculated based on the set of quadrature signals (Bsin1, Bcos1) derived from the signals (By1, Bz1) measured at the first sensor location (above the inner track) by using the same linear transformation as in FIG. 5(b) with the same coefficients, in case of a radial misposition of 0.1 mm.

FIG. 7(a) shows a waveform similar to the waveform of FIG. 5(c), indicative for the angular error of the sensor device 220 relative to the inner ring 211, as would be obtained when applying the linear transformation mentioned above, using the same coefficients mentioned above (e.g. being hardcoded, or retrieved from the non-volatile memory), in case of a mechanical mispositioning of 0.1 mm. As can be seen, the angle α1 has a worst-case error of about ±1.5°.

Figure 7B:
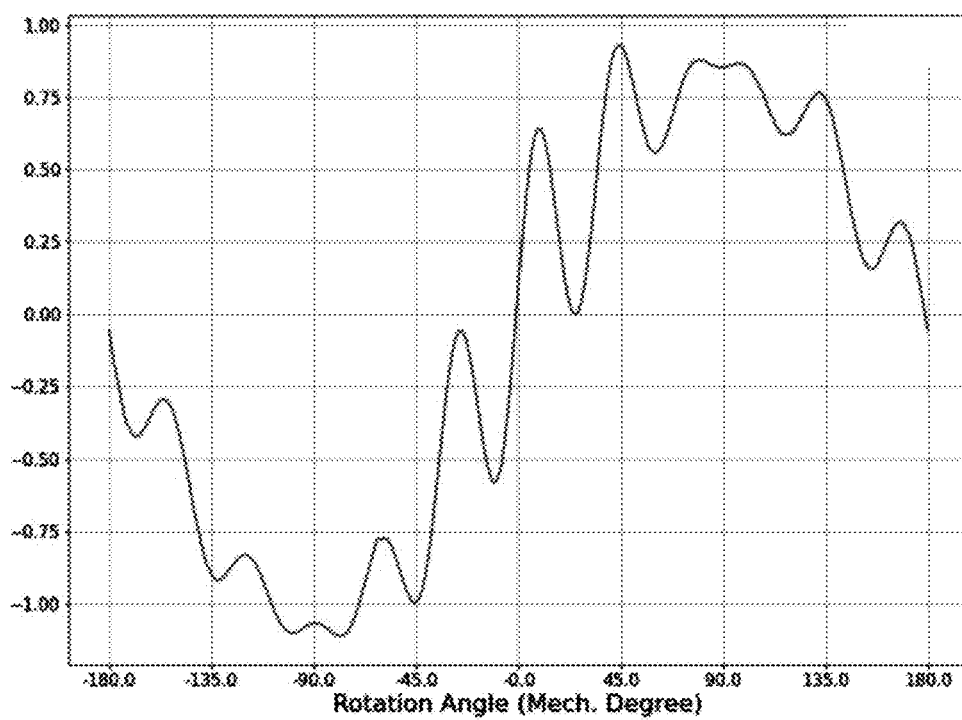
FIG. 7(b) shows a waveform illustrating the angular error between the actual angular position, and an angular position a2 calculated based on the set of quadrature signals (Bsin2, Bcos2) derived from the signals (By2, Bz2) measured at the second sensor location (above the outer track) by using the same linear transformation as in FIG. 6(b) with the same coefficients, in case of a radial misposition of 0.1 mm.

FIG. 7(b) shows a waveform similar to the waveform of FIG. 6(c), indicative for the angular error of the sensor device 220 relative to the outer ring 212, as would be obtained when applying the linear transformation mentioned above, using the same coefficients mentioned above (e.g. being hardcoded, or retrieved from the non-volatile memory), in case of a mechanical mispositioning of 0.1 mm. As can be seen, the angle α2 has a worst-case error of about ±1.0°.

Since the angular position α1 only needs to be known for solving the ambiguity of the outer ring, the inaccuracy of the outer ring 212 is dominant in this case, since it has the larger number of pole pairs. It can thus be understood that the overall error of the overall angular position sensor system 200 using a fixed, predefined set of coefficients would be about ±1.0° in case of a mispositioning of 0.1 mm, which is acceptable for some application, but too large for some applications.

One solution to reduce this inaccuracy is to increase the number of pole pairs, which will typically increase the cost of the magnetic source 210. Another solution to address this problem of mispositioning, already suggested above, is to determine the optimum coefficients in a calibration test, after assembling the position sensor system, and storing the coefficients in a non-volatile memory of the device. This works if the mispositioning is static but does not work if the mispositioning drifts over time. Yet another solution which also works if the mispositioning drifts over time will be described further, when discussing FIG. 11 and FIG. 13.

FIG. 8(a) to FIG. 8(h) show examples of sensor devices with various sensor structures as may be used in embodiments of the present invention.

Figure 8A:
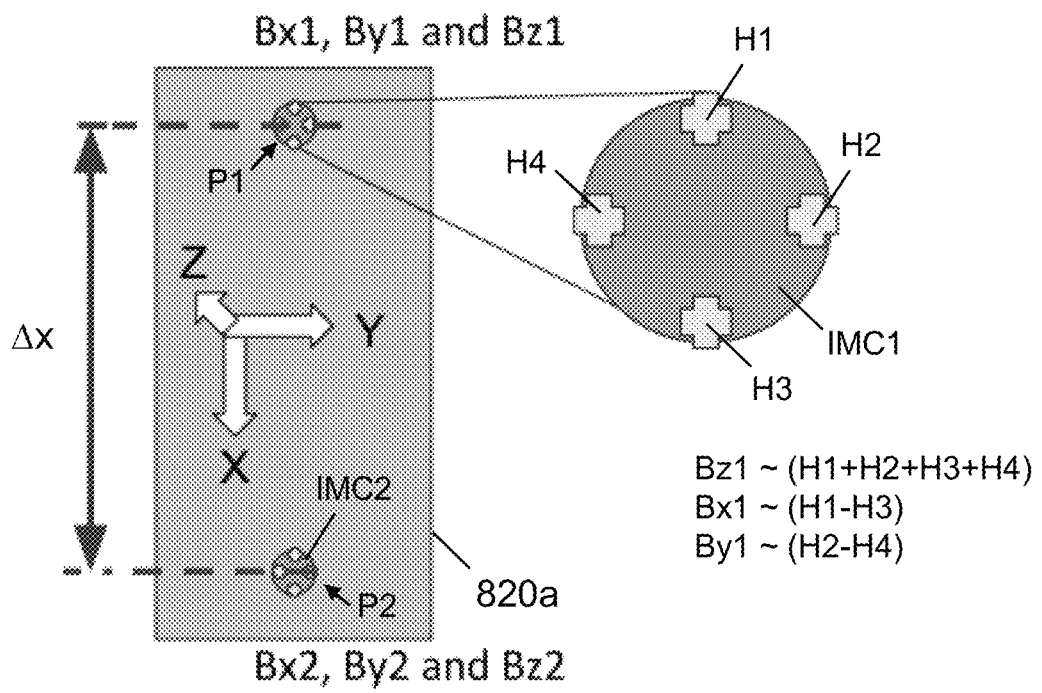
FIG. 8(a) to FIG. 8(h) show examples of sensor devices with various sensor structures as may be used in embodiments of the present invention.

FIG. 8(a) shows a schematic representation of a sensor device 820a with two magnetic sensors structures spaced apart over a predefined distance Δx along the X-axis, as can be used in embodiments of the present invention. Each sensor structure of this device comprises four horizontal Hall elements H1-H4 arranged near the periphery of an integrated magnetic flux concentrator IMC. Each sensor structure is capable of measuring three orthogonal magnetic field components, Bx, By, Bz, as described in more detail in patent publication EP3650816(A1) and in patent application EP20191167.4 mentioned above. In order to understand the present invention, it suffices to know that the component Bx1 is proportional to (H1-H3), and that the component By1 is proportional to (H2-H4), and that the component Bz is proportional to (H1+H2) or to (H2+H4) or to (H1+H2+H3+H4). Thus, the sensor device 820a has eight magnetic sensor elements, and is capable of measuring two sets of three orthogonal magnetic field components, namely (Bx1, By1, Bz1) at a first sensor position P1, and (Bx2, By2, Bz2) at a second sensor position P2. But the present invention is not limited to this particular sensor device, and devices with other sensor structures may also be used.

Figure 8B:
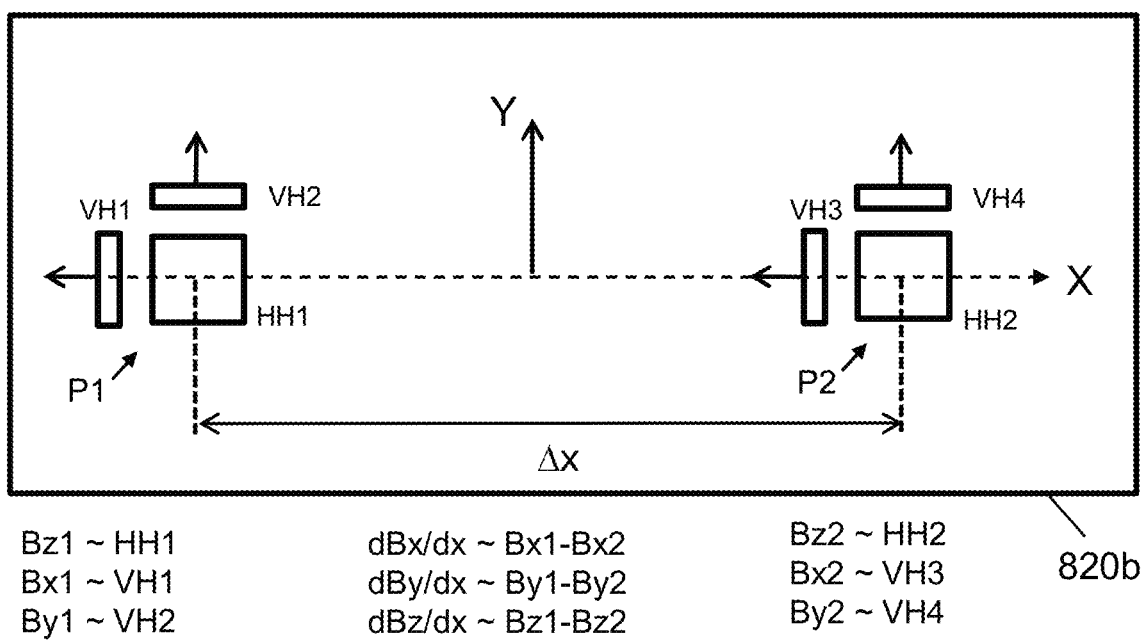

FIG. 8(b) shows another sensor device comprising two magnetic sensors structures spaced apart over a predefined distance Δx, each sensor structure comprising one horizontal Hall element (for measuring Bz) and two vertical Hall elements, one for measuring Bx, and one for measuring By. The magnetic sensor device 820b is thus also capable of measuring three orthogonal magnetic field components, namely (Bx1, By1, Bz1) at the first sensor position P1, and (Bx2, By2, Bz2) at the second sensor position P2.

Figure 8C:
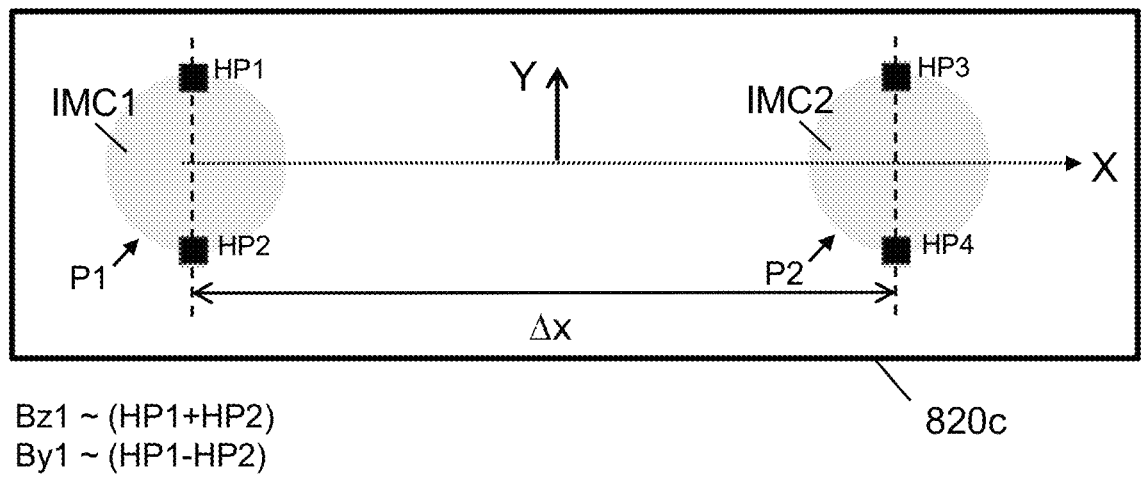

FIG. 8(c) shows another sensor device comprising two magnetic sensors structures spaced apart over a predefined distance Δx, each sensor structure comprising only two horizontal Hall elements arranged on opposite sides of an IMC disk and located on a virtual line perpendicular to the X-axis. Each sensor structure is capable of measuring two orthogonal components By, Bz at each of the sensor locations P1, P2. It is an advantage of this sensor device that it requires only four horizontal Hall elements instead of eight.

Figure 8D:
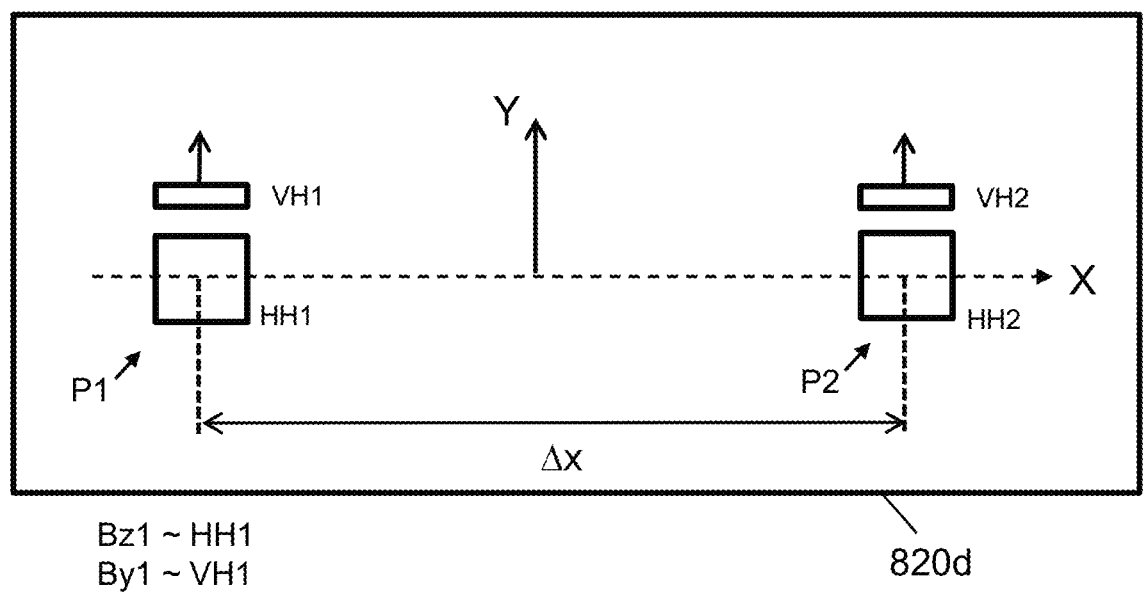

FIG. 8(d) shows another sensor device comprising two magnetic sensors structures spaced apart over a predefined distance Δx, each sensor structure comprising one horizontal Hall element and one vertical Hall element. Each sensor structure is capable of measuring two orthogonal components By, Bz. It is an advantage of this sensor device that it does not require integrated magnetic flux concentrators, hence may be easier to produce.

Figure 8E:
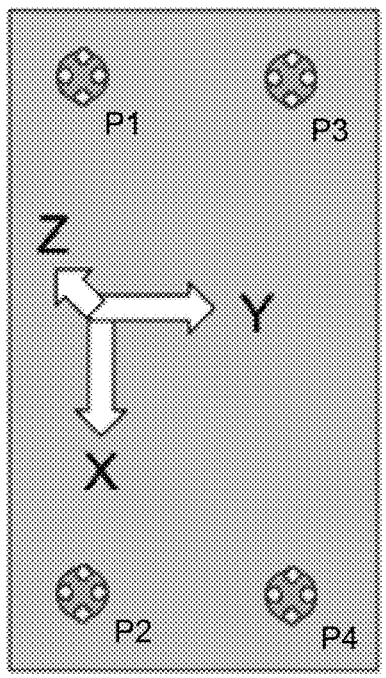
Figure 8F:
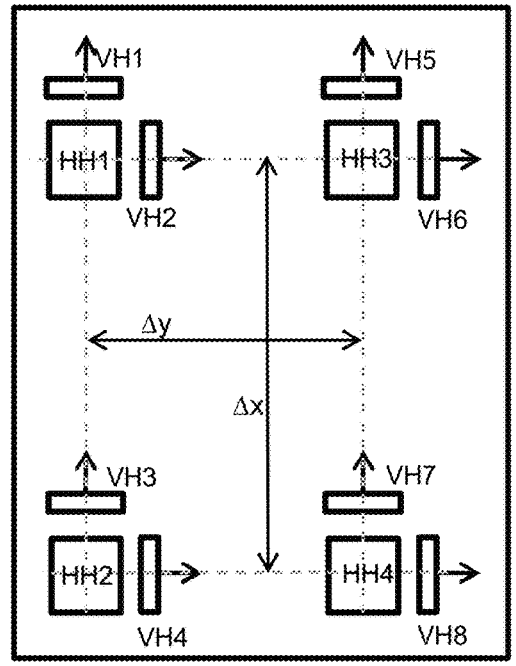

FIG. 8(e) shows a variant of FIG. 8(a), and FIG. 8(f) shows a variant of FIG. 8(b). The sensor devices of FIG. 8(e) and of FIG. 8(f) each comprise four sensor structures spaced apart in the X and in the Y-direction, instead of only two sensor structures. These devices are capable not only of measuring (Bx1, By1, Bz1) at P1, and (Bx2, By2, Bz2) at P2, but are also capable of determining spatial gradients of Bx, By and Bz at the two sensor locations P1, P2 along the circumferential direction, i.e. (dBx/dy, dBy/dy, dBz/dy).

The gradient signals dBy/dy and dBz/dy at P1 and P2 can then be transformed into two sets of quadrature signals in a similar manner as described above, e.g. using a set of linear or polynomial equations with a relatively small number of coefficients, e.g. predefined coefficients, which may be determined by simulation, or by measurement, or after assembly. The coefficients may be stored in non-volatile memory. A first angle α1 relative to the inner ring, and a second angle α2 relative to the second ring can then be calculated based on an arctangent function of the quadrature signals. It is an advantage that the gradient signals are highly insensitive to an external disturbance field, and thus also the overall angular position will be highly insensitive to an external disturbance field.

According to principles of the present invention, the distance Δx between the sensor positions P1 and P2, and between the sensor positions P3 and P4 are smaller than the distance "dt" between two centrelines, e.g. at least 20% smaller. The distance Δy does not need to be matched to the pole distances but is used to determine gradient signals along the Y-direction. The value of Δy may be substantially equal to Δx, but that is not absolutely required, and it is also possible that Δy is larger or smaller than Δx. The distance Δy is preferably not too small, because otherwise the SNR of the difference signal may become too small. The distance Δy is preferably not too large, because otherwise the difference signal will deviate more from a spatial derivative, which may decrease the accuracy, and also because the cost of the sensor device increases as the area of the semiconductor substrate increases. The skilled person having the benefit of the present disclosure can find a reasonable compromise.

In preferred embodiments, each of the distances Δx and Δy are smaller than the track distance "dt", e.g. at least 20% smaller.

Figure 8G:
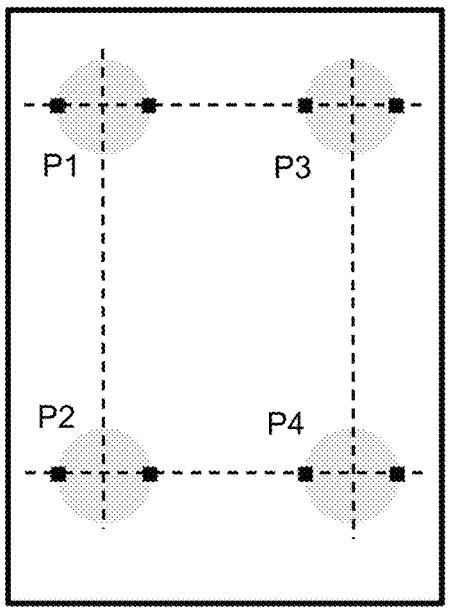

FIG. 8(g) shows a variant of FIG. 8(c) further capable of measuring magnetic field gradient signals dBy/dy and dBz/dy. But FIG. 8(g) can also be considered to be a variant of FIG. 8(e), not capable of determining Bx or dBx/dy, which are not used in all embodiments of the present invention.

Figure 8H:
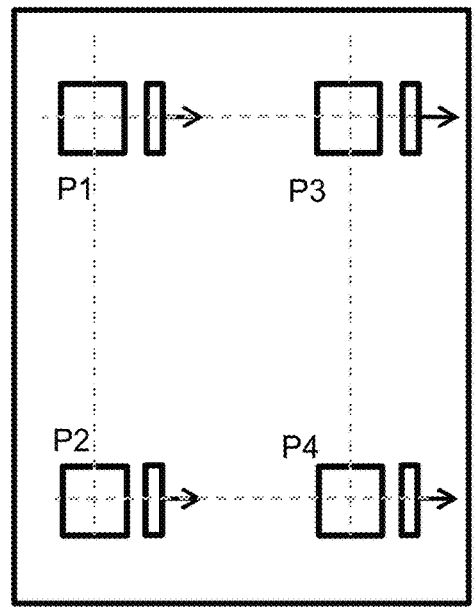

FIG. 8(h) shows a variant of FIG. 8(d) further capable of measuring magnetic field gradient signals dBy/dy and dBz/dy. But FIG. 8(h) can also be considered to be a variant of FIG. 8(f), not capable of determining Bx or dBx/dy, which are not used in all embodiments of the present invention.

Functionally the sensor device of FIG. 8(a) and FIG. 8(b) the same capabilities, the sensor device of FIG. 8(c) and FIG. 8(d) have the same capabilities, the sensor device of FIG. 8(e) and FIG. 8(f) have the same capabilities, and the sensor device of FIG. 8(g) and FIG. 8(h) have the same capabilities.

FIG. 8(a) to FIG. 8(h) show various examples of sensor devices which can be used in embodiments of the present invention, but the present invention is not limited thereto, and other sensor structures may also be used, for example sensor structures comprising magneto-resistive elements.

The predefined distance Δx may be a value in the range from about 1.0 mm to about 3.0 mm, e.g. from about 1.5 mm to about 2.5 mm, e.g. equal to about 2.0 mm. The predefined distance Δy may be a value in the range from about 0.5 mm to about 3.0 mm. As mentioned above, Δy (to be oriented in the circumferential direction of the magnetic source) may be larger or smaller than Δx (to be oriented in the radial direction of the magnetic source).

Figure 9:
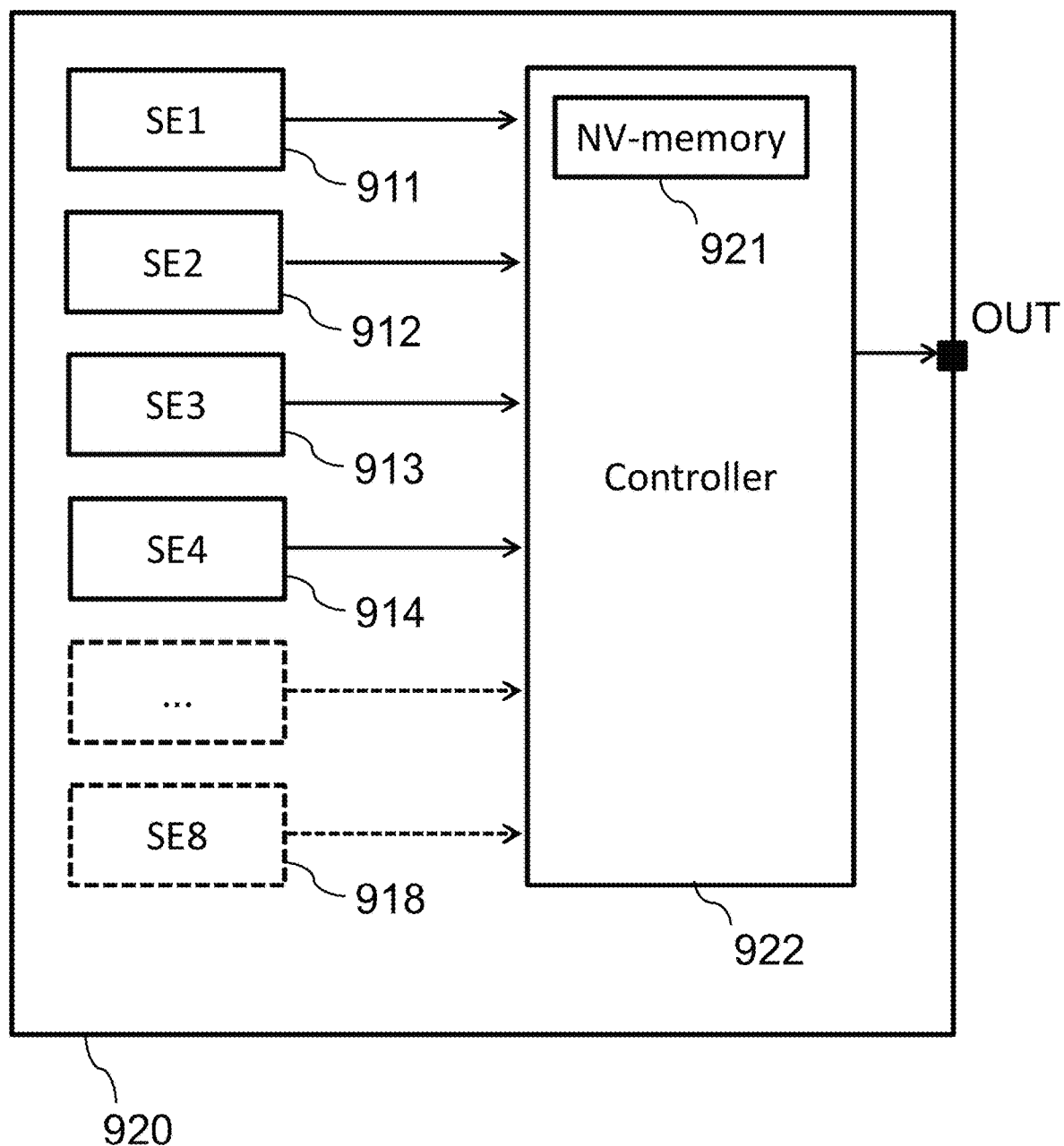
FIG. 9 shows a high-level block-diagram of a sensor device as can be used in embodiments of the present invention.

FIG. 9 shows a high-level block-diagram of a sensor device 920 as can be used in embodiments of the present invention. In fact, the hardware may be similar or identical to the hardware of the devices described in patent publication EP3650816(A1) and in patent application EP20191167.4, but the algorithm performed by the controller 922 is different, as will be described in FIG. 10 to FIG. 14. A brief description of the hardware is provided here for completeness.

The position sensor device 920 of comprises a plurality of magnetic sensor elements (in the example: SE1 to SE8), arranged in a particular manner on a semiconductor substrate, e.g. as shown in FIG. 8(a) to FIG. 8(f).

The position sensor device 920 further comprises a processing circuit 922, for example a programmable processing unit adapted for determining, e.g. calculating a set of values (By1, Bz1, By2, Bz2) or a set of values (Bx1, By1, Bz1, Bx2, By2, Bz2) based on the signals obtained from the sensor elements, e.g. by summation or subtraction, and/or amplification, and/or digitization, etc.

The processing unit 922 is further adapted for determining a linear or an angular position according to one of the algorithms as will be described further in FIG. 10 to FIG. 14. This position may be provided at an output of the device, e.g. in a digital or analog manner.

While not explicitly shown, the sensor device 920 typically also comprises biasing circuitry, readout circuitry, one or more amplifiers, analog-to-digital convertors (ADC), etc. Such circuits are well known in the art and are not the main focus of the present invention.

Devices used in the present invention comprise at least four sensor elements, but they may comprise more than four sensor elements, e.g. eight sensor elements or twelve sensor elements, or sixteen sensor elements. The sensor elements may be chosen from the group consisting of: horizontal Hall elements, vertical Hall elements, magneto-resistive elements, e.g. XMR or GMR elements, etc.

Figure 10:
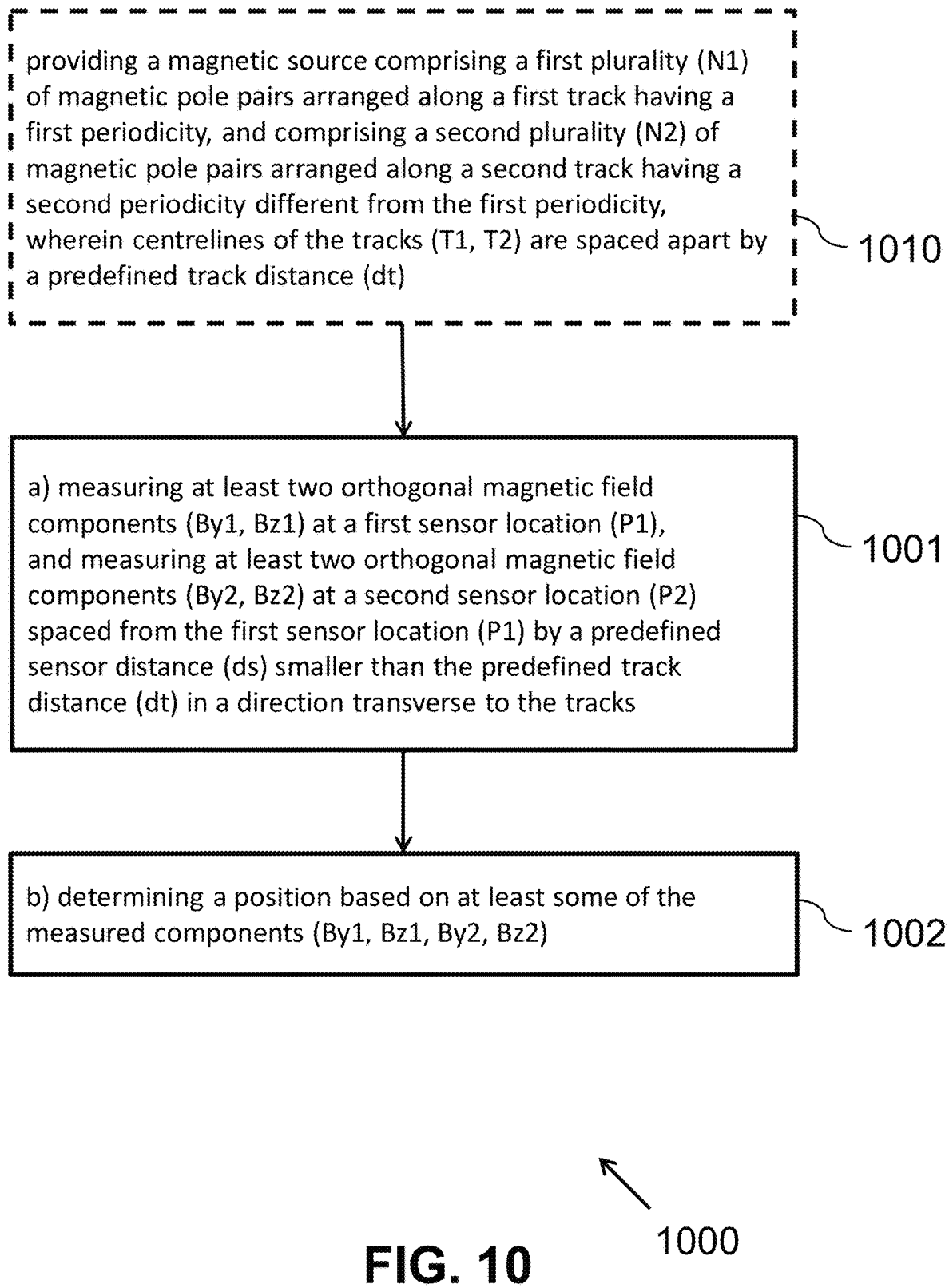
FIG. 10 to FIG. 14 show flow-charts of methods of determining a linear or angular position, of a sensor device relative to a magnetic source, proposed by the present invention.

FIG. 10 shows a flow-chart of a method 1000 of determining a position (e.g. a liner or angular position) of a sensor device movable along a predefined path (e.g. linear or circular path) relative to a magnetic source, wherein the magnetic source comprises a first plurality Ni of magnetic pole pairs arranged along a first track Ti having a first periodicity, and comprises a second plurality N2 of magnetic pole pairs arranged along a second track T2 having a second periodicity different from the first periodicity, and wherein centrelines 213, 214 of the tracks T1, T2 are spaced apart by a predefined track distance "dt". The method 1000 comprises the following steps:

a) measuring 1001 at least two orthogonal magnetic field components (e.g. By1, Bz1) at a first sensor location P1, and measuring at least two orthogonal magnetic field components (e.g. By2, Bz2) at a second sensor location P2, spaced from the first sensor location P1 by a predefined sensor distance "ds" smaller than the predefined track distance "dt" in a direction transverse to the tracks;

b) determining 1002 the position of the sensor device (e.g. linear or angular position) along the predefined path (e.g. linear or circular or curved path) based on at least some of the at least four measured magnetic field components (By1, Bz1, By2, Bz2).

Preferably one of the magnetic field components (indicated as By in this application) is tangential to the direction of relative movement, and preferably the other magnetic field component (indicated as Bz in this application) is orthogonal to the direction of relative movement. The latter is preferably also orthogonal to the semiconductor substrate, although that is not absolutely required.

The method may also comprise the step of: providing 1010 a magnetic source comprising a first plurality (N1) of magnetic pole pairs arranged along a first track T1 having a first periodicity, and comprising a second plurality (N2) of magnetic pole pairs arranged along a second track T2 having a second periodicity different from the first periodicity, wherein centrelines 213, 214 of the tracks T1, T2 are spaced apart by a predefined track distance "dt". This step is indicated as optional (dotted lines), because it is not really part of the algorithm performed by the processor of the sensor device, but rather a precondition or prerequisite.

The position of the sensor device relative to the magnetic source can be determined in several ways, a few of which are described next:

In an embodiment, "determining said position based on at least a subset of the measured signals" comprises: i) calculating two sets of quadrature components as a linear combination of only two magnetic field components, for example as depicted in FIG. 4, and then ii) calculating or determining a first angle $\alpha 1$ by using an arctangent function of the first set of quadrature components (Bsin1, Bcos1), and calculating or determining a second angle $\alpha 2$ by using an arctangent function of the second set of quadrature components (Bsin2, Bcos2), and iii) by finding the overall linear or angular position based on said first and said second angle $\alpha 1$, $\alpha 2$ (e.g. by solving the ambiguity).

In a variant of this embodiment, a non-linear transformation is used to convert the measured signals into quadrature signals, e.g. using a set of non-linear equations, e.g. second order or third order equations.

In another embodiment, "determining said position based on at least a subset of the measured signals" comprises: i) calculating or determining a first angle $\alpha 1$ by using an arctangent function of the first set of measured components By1, Bz1, and calculating or determining a second angle $\alpha 2$ by using an arctangent function of the second set of measured components By2, Bz2, then ii) correcting the first angle $\alpha 1$ according to a first predefined, non-linear function (e.g. stored in a non-volatile memory of the sensor device as a first piece-wise-linear approximation), and correcting the second angle $\alpha 2$ according to a second predefined, non-linear function (e.g. stored in the non-volatile memory as a second piecewise linear approximation), and iii) by finding the overall linear or angular position based on said first and said second corrected angles (e.g. by solving the ambiguity).

In yet another embodiment, "determining said position based on at least a subset of the measured signals" comprises: i) calculating or determining a first angle $\alpha 1$ by using a first "modified arctangent function" of the first set of measured components (By1, Bz1), and calculating or determining a second angle $\alpha 1$ by using a second "modified arctangent function" of the second set of measured components (By2, Bz2); and ii) by finding the linear or angular position based on said first and said second angle $\alpha 1$, $\alpha 2$.

The first angle $\alpha 1$ may be calculated (in step i) in accordance with the following formula:

$\alpha 1 = \arctan(K1 + K2*(Bz1/By1))$, where By1 and Bz1 are two magnetic field components measured at the first sensor location P1, and K1 and K2 are predefined constants; and the second angle $\alpha 2$ may be calculated (in step i) in accordance with the following formula: $\alpha 2 = \arctan(K3 + K4*(Bz2/By2))$, where By2 and Bz2 are two magnetic field components measured at the second sensor location P3, and K3 and K4 are predefined constants. The predefined coefficients and/or the predefined constants may be determined by design, by simulation, or by a calibration, and may be stored in a non-volatile memory of the sensor device.

There are but three possible ways to determine the position, but the present invention is not limited hereto, and other ways may also be used.

While not shown in FIG. 10, step a) may further comprise: measuring at least two orthogonal magnetic field components (By3, Bz3) at a third sensor location (P3) spaced from the first sensor location (P1) by a predefined distance (Δy), and measuring at least two orthogonal magnetic field components (By4, Bz4) at a fourth sensor location (P4) spaced from the second sensor location (P2) by a predefined distance (Δy) and spaced from the third sensor location (P3) by the predefined sensor distance (ds); and step b) may further comprise: determining magnetic field gradients dBy/dy and dBz/dy at the first and second sensor location P1, P2 (e.g. as illustrated in FIG. 8(f)), and determining the position of the sensor device based on these gradients (e.g. by first converting the gradients into quadrature signals, and then taking an arctangent of these quadrature signals to obtain α1 and α2, and then resolving the ambiguity).

In addition to the advantages mentioned above, this method offers the further advantage of being highly insensitive to an external strayfield.

Figure 11:
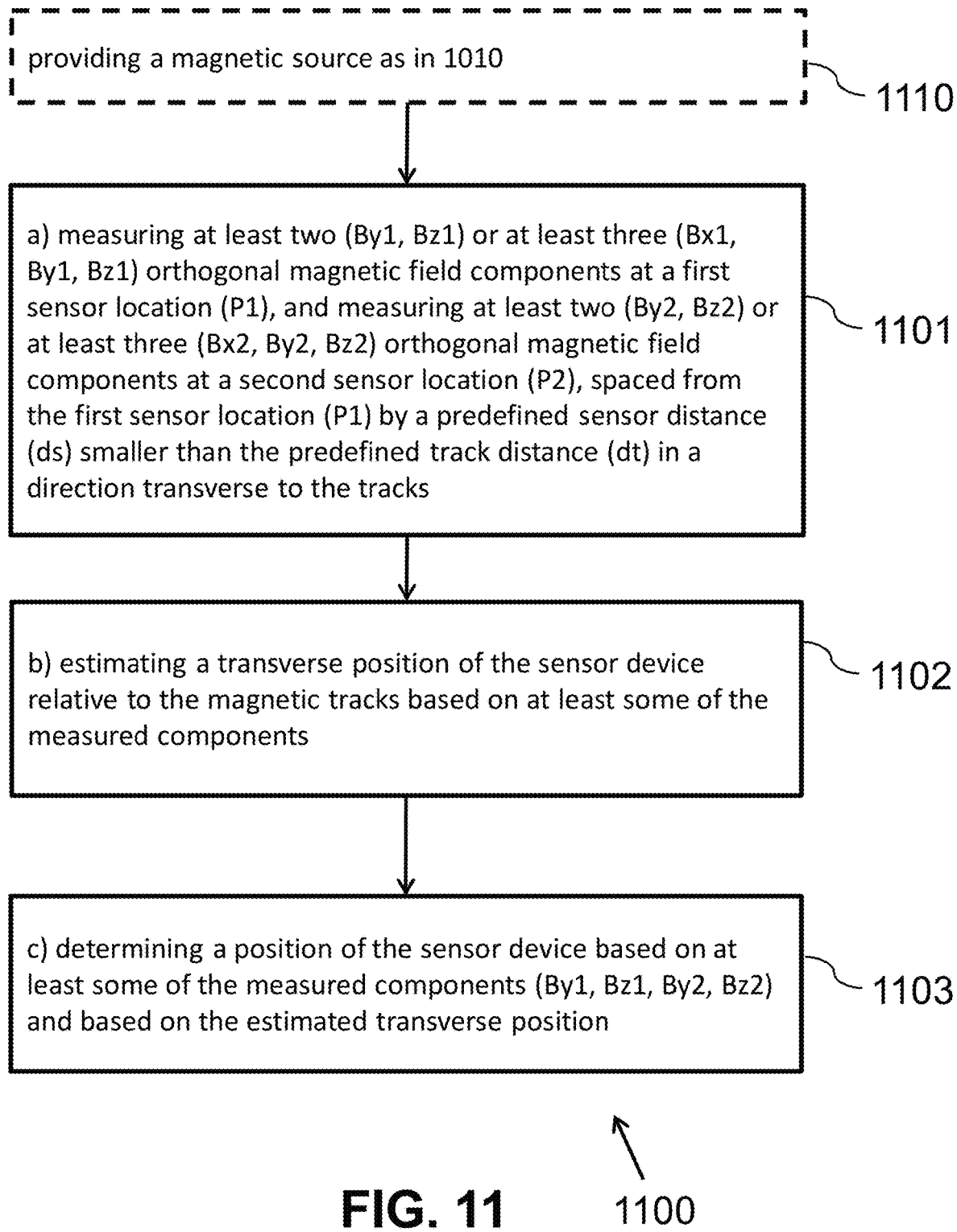

FIG. 11 shows a flow-chart of a method 1100 of determining a position (e.g. a linear or angular position) of a sensor device movable along a predefined path (e.g. linear or circular path) relative to a magnetic source, wherein the magnetic source comprises a first plurality N1 of magnetic pole pairs arranged along a first track T1 having a first periodicity, and comprises a second plurality N2 of magnetic pole pairs arranged along a second track T2 having a second periodicity different from the first periodicity, and wherein centrelines 213, 214 of the tracks T1, T2 are spaced apart by a predefined track distance "dt". This method can be seen as a special case of the method of FIG. 10. The method 1100 comprises the following steps:

a) measuring 1101 at least two (e.g. By1, Bz1) or at least three (e.g. Bx1, By1, Bz1) orthogonal magnetic field components at a first sensor location P1, and measuring at least two (e.g. By2, Bz2) or at least three (e.g. Bx2, By2, Bz2) orthogonal magnetic field components at a second sensor location P2, spaced from the first sensor location P1 by a predefined sensor distance "ds" smaller than the predefined track distance "dt" in a direction transverse to the tracks;
 b) estimating 1102 a transverse position of the sensor device relative to the magnetic tracks based on at least some of the measured components;
 c) determining 1103 the position of the sensor device based on at least some of the measured components (e.g. By1, Bz1, By2, Bz2) and based on the estimated transverse position.

In the system of FIG. 15(a) and FIG. 15(b) the transverse position is a radial offset, e.g. an (unintended) offset from its nominal (intended) mounting position for which the coefficients of the equations of FIG. 4 were optimized. In the system of FIG. 15(c), the transverse position is a lateral offset.

In an embodiment, the transverse position of the sensor device is estimated or determined based on one or more of the following ratios: |Bx1|/|Bz1| or |Bx1|/|By1| or |By1|/|Bz1| or |Bx2|/|Bz2| or |Bx2|/|By2| or |By2|/|Bz2| at one or more predefined positions. The predefined position may be estimated using an initial or predefined set of coefficients. In a variant, the transverse position of the sensor device is estimated or calculated based on a maximum value of one or more of said ratios, considered over substantially the entire measurement range (e.g. over a full rotation or over the full stroke), or may be based on the value of the gradient |dBx/dx| at one or more angular positions or in an angular subrange, or may be based on the maximum value of the gradient |dBx/dx| over the measurement range. The gradient |dBx/dx| may be calculated as |Bx1−Bx2| or proportional thereto, where Bx1 is measured at the first sensor location P1, and Bx2 is measured at the second sensor location P2. Looking back at the simulations of FIG. 3(c), the inventors came to the insight that, even though the signal Bx (oriented in the radial direction) seems to be completely useless to determine the angular position, it can be very advantageously used to determine radial offset, which in turn allows to dynamically adjust the coefficients, which allows to improve the accuracy despite said radial offset.

In other words, it is an advantage of the method of FIG. 11 that it allows the effect of position offset (as was discussed in FIG. 7(a) and FIG. 7(b) to be mitigated. In this way, the accuracy of the position sensor system can be improved, and the mounting requirements can be relaxed, and the size of sensor device can be reduced (because ds<dt).

In a variant of the method of FIG. 11, step a) comprises measuring magnetic field components at four different locations P1 to P4 (e.g. as shown in FIG. 8(e) to FIG. 8(h)), and determining magnetic field gradients, and determining the position based on these gradients (e.g. similar as described in the variant of FIG. 10). This method not only offers the advantage of being highly insensitive to position offset, but also offers the advantage of being highly insensitive to an external strayfield.

Figure 12:
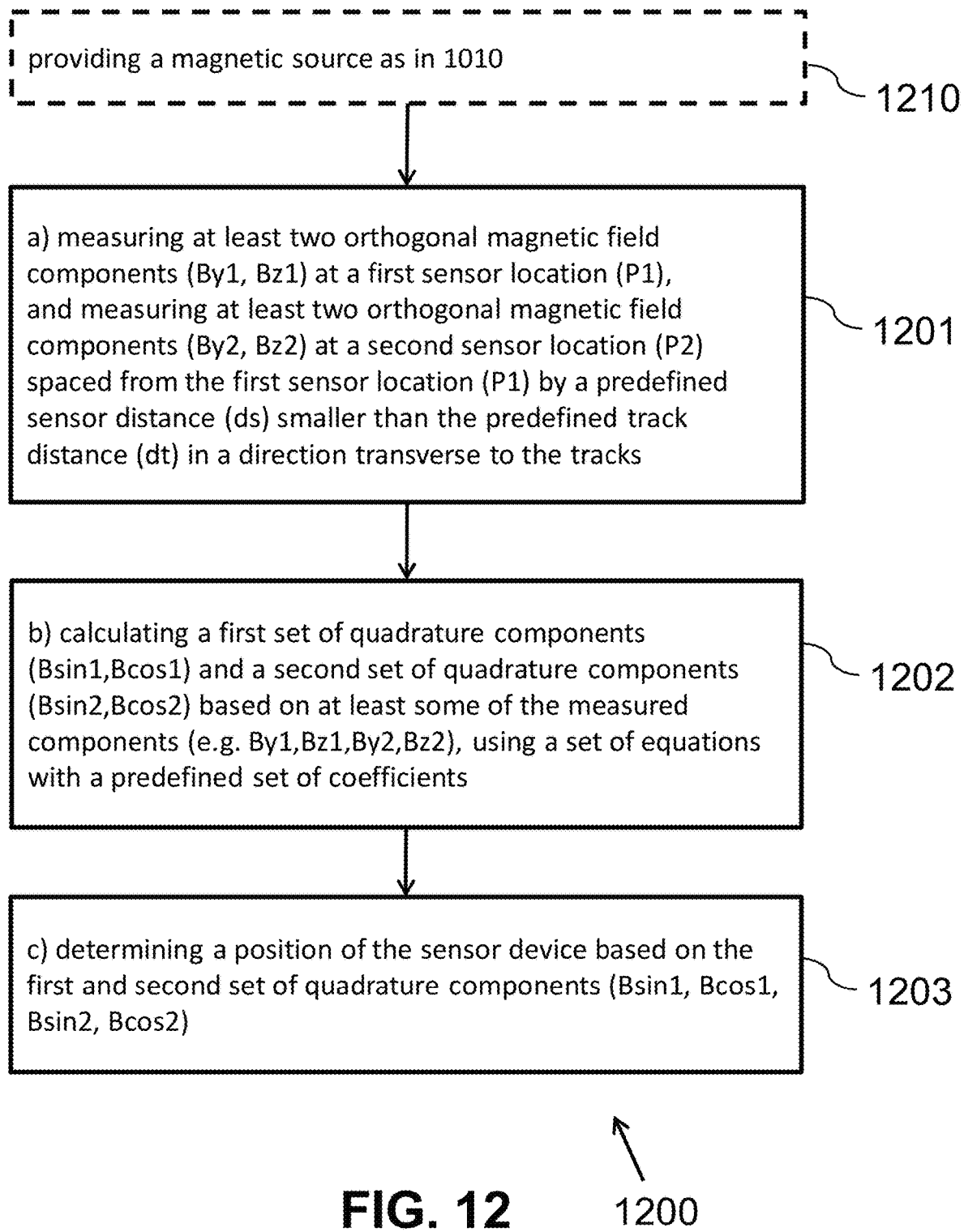

FIG. 12 shows a flow-chart of a method 1200 of determining a position (e.g. a linear or angular position) of a sensor device movable along a predefined path (e.g. linear or circular path) relative to a magnetic source, wherein the magnetic source comprises a first plurality Ni of magnetic pole pair arranged along a first track Ti having a first periodicity, and comprises a second plurality N2 of magnetic pole pairs arranged along a second track T2 having a second periodicity different from the first periodicity, and wherein centrelines 213, 214 of the tracks T1, T2 are spaced apart by a predefined track distance "dt". This method can be seen as a special case of the method of FIG. 10. The method 1200 comprises the following steps:

a) measuring 1201 at least two orthogonal magnetic field components (e.g. By1, Bz1) at a first sensor location P1, and measuring at least two orthogonal magnetic field components (e.g. By2, Bz2) at a second sensor location P2, spaced from the first sensor location P1 by a predefined sensor distance "ds" smaller than the predefined track distance "dt" in a direction transverse to the tracks;
 b) calculating 1202 a first set of quadrature components Bsin1, Bcos1 and a second set of quadrature components Bsin2, Bcos2 based on at least some of the measured components (e.g. By1, Bz1, By2, Bz2), using a set of equations with a predefined set of coefficients (e.g. a set of only eight predefined coefficients);
 c) determining 1203 the position of the sensor device based on the first and second set of quadrature components Bsin1, Bcos1, Bsin2, Bcos2.

In an embodiment, step c) comprises calculating a first angle α1 and a second angle α2 using an arctangent function and finding an overall angle α by resolving the ambiguity related to the first periodicity and the second periodicity.

In a variant of the method of FIG. 12, step a) comprises measuring two orthogonal magnetic field components in at least four different sensor locations P1-P4, and determining magnetic field gradients; and step b) comprises: calculating a first and second set of quadrature signals based on these gradients. This method would be highly robust against an external disturbance field.

Figure 13:
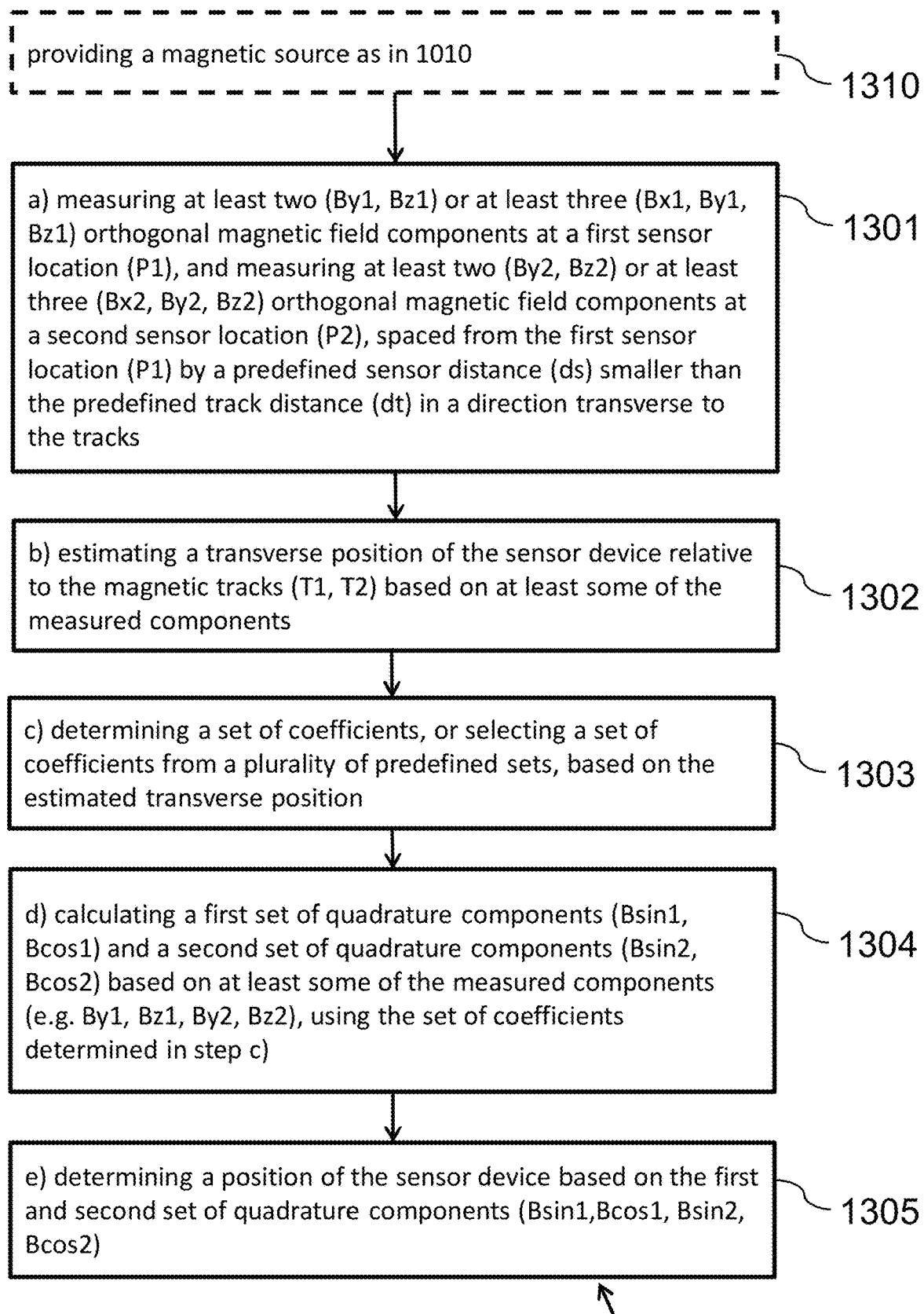

FIG. 13 shows a flow-chart of a method 1300 of determining a position (e.g. a linear or angular position) of a sensor device movable along a predefined path (e.g. a linear or circular path) relative to a magnetic source, wherein the magnetic source comprises a first plurality Ni of magnetic pole pairs arranged along a first track T1 having a first periodicity, and comprises a second plurality N2 of magnetic pole pairs arranged along a second track T2 having a second periodicity different from the first periodicity, and wherein centrelines 213, 214 of the tracks T1, T2 are spaced apart by a predefined track distance "dt". This method can be seen as a special case and/or as a variant or combination of the methods of FIG. 10, FIG. 11 and FIG. 12. The method 1300 comprises the following steps:
- a) measuring 1301 at least two (e.g. By1, Bz1) or at least three (e.g. Bx1, By1, Bz1) orthogonal magnetic field components at a first sensor location P1, and measuring at least two (e.g. By2, Bz2) or at least three (e.g. Bx2, By2, Bz2) orthogonal magnetic field components at a second sensor location P2, spaced from the first sensor location P1 by a predefined sensor distance "ds" smaller than the predefined track distance "dt" in a direction transverse to the tracks;
- b) estimating 1302 a transverse position of the sensor device relative to the magnetic tracks based on at least some of the measured components;
- c) determining a set of coefficients or selecting 1303 a set of coefficients from a plurality of predefined sets, based on the estimated transverse position. These predefined sets may be stored in a non-volatile memory of the device. Depending on the estimated transverse position one of the predefined sets may simply be selected, or an interpolation between two sets of coefficients could be performed.
- d) calculating 1304 a first set of quadrature components Bsinl, Bcosl and a second set of quadrature components Bsin2, Bcos2 based on at least some of the measured components (e.g. By1, Bz1, By2, Bz2), using the set of coefficients determined in step c);
- e) determining 1305 the position of the sensor device based on the first and second set of quadrature components Bsinl, Bcosl, Bsin2, Bcos2.

It is an advantage of this method that the set of coefficients is not fixed, but is dynamically adjusted, depending on the estimated transverse position. This offers the advantage of mitigating the effect of lateral offset (e.g. due to mechanical tolerances), and thus may the position error (e.g. as discussed in FIGS. 7(a) and 7(b)).

It is noted that the transverse position need not be measured in each and every particular position but is a long-term effect. It is therefore possible to determine the estimated transverse position "between" two actual position measurements, e.g. during an in-situ self-calibration-procedure or the like, optionally taking into account historical data, such as maximum signal values over the entire measurement range, or one or more of the above mentioned ratios (e.g. |Bx|/|Bx|, etc.). In other words, step b) and step c) need not necessarily be performed between step a) and step e), and step b) and step c) need not be performed every executing of the method of FIG. 13, but may be skipped. Of course, if historical data is stored in the non-volatile memory, extra memory space needs to be allocated.

Figure 14:
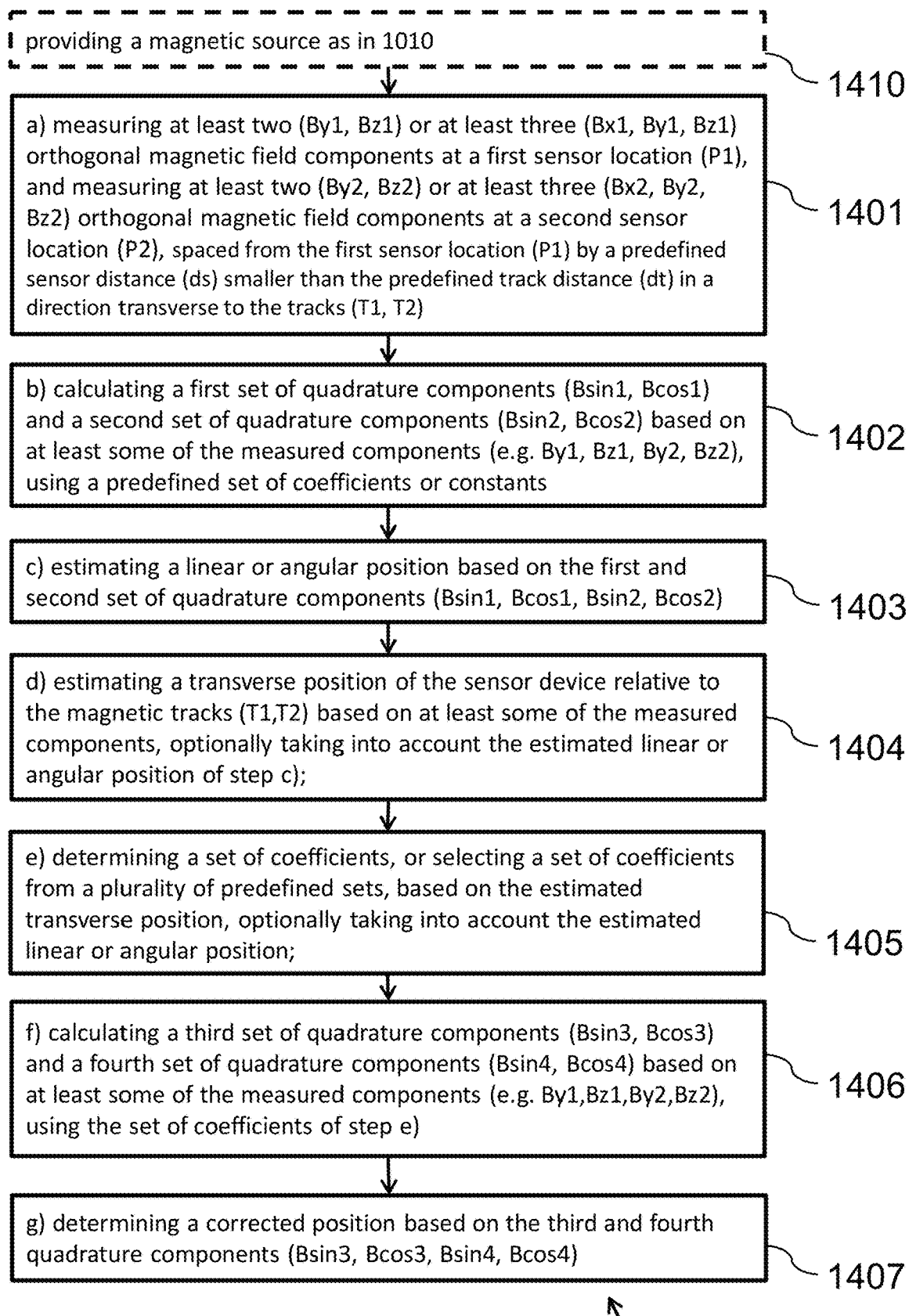

FIG. 14 shows a flow-chart of a method 1400 of determining a position (e.g. a linear or angular position) of a sensor device movable along a predefined path (e.g. linear or circular path) relative to a magnetic source, wherein the magnetic source comprises a first plurality Ni of magnetic pole pairs arranged along a first track Ti having a first periodicity, and comprises a second plurality N2 of magnetic pole pairs arranged along a second track T2 having a second periodicity different from the first periodicity, and wherein centrelines 213, 214 of the tracks T1, T2 are spaced apart by a predefined track distance "dt". This method can be seen as a special case of FIG. 10, and/or as a variant or combination of the methods of FIG. 11 to FIG. 14. The method 1400 comprises the following steps:
- a) measuring 1401 at least two (e.g. By1, Bz1) or at least three (e.g. Bx1, By1, Bz1) orthogonal magnetic field components at a first sensor location P1, and measuring at least two (e.g. By2, Bz2) or at least three (e.g. Bx2, By2, Bz2) orthogonal magnetic field components at a second sensor location P2, spaced from the first sensor location P1 by a predefined sensor distance "ds" smaller than the predefined track distance "dt" in a direction transverse to the tracks T1, T2;
- b) calculating 1402 a first set of quadrature components (Bsinl, Bcosl) and a second set of quadrature components (Bsin2, Bcos2) based on at least some of the measured components (e.g. By1, Bz1, By2, Bz2), using a predefined set of coefficients or constant; (for example based on an initial, predefined set of coefficients);
- c) estimating 1403 a linear or angular position based on the first and second set of quadrature components (Bsin1, Bcos1, Bsin2, Bcos2);
- d) estimating 1404 a transverse position of the sensor device relative to the magnetic tracks (T1, T2° based on at least some of the measured components, optionally taking into account the estimated linear or angular position of step c);
- e) determining a set of coefficients, or selecting 1405 a set of coefficients from a plurality of predefined sets, based on the estimated transverse position, optionally taking into account the estimated linear or angular position of step c);
- f) calculating 1406 a third set of quadrature components (Bsin3, Bcos3) and a fourth set of quadrature components (Bsin4, Bcos4) based on at least some of the measured components (e.g. By1, Bz1, By2, Bz2), using the (new) set of coefficients of step e);
- g) determining 1407 a corrected position (e.g. linear or angular position) of the sensor device based on the third and fourth set of quadrature components Bsin3, Bcos3, Bsin4, Bcos5.

As mentioned above, it is not required to perform steps d) and e) each and every execution. It suffices for example to perform steps d) and e) only now and then (e.g. once every second, or once every minute, or even once every hour, depending on the application), because lateral offset is related to mispositioning, which is typically a long-term effect. Furthermore, it is not required that steps d) and e) are performed for each and every (linear or angular) position, but in some embodiments of the present invention, they are only executed within certain angular ranges, or at certain angular positions (with some tolerance margin).

Figure 16:
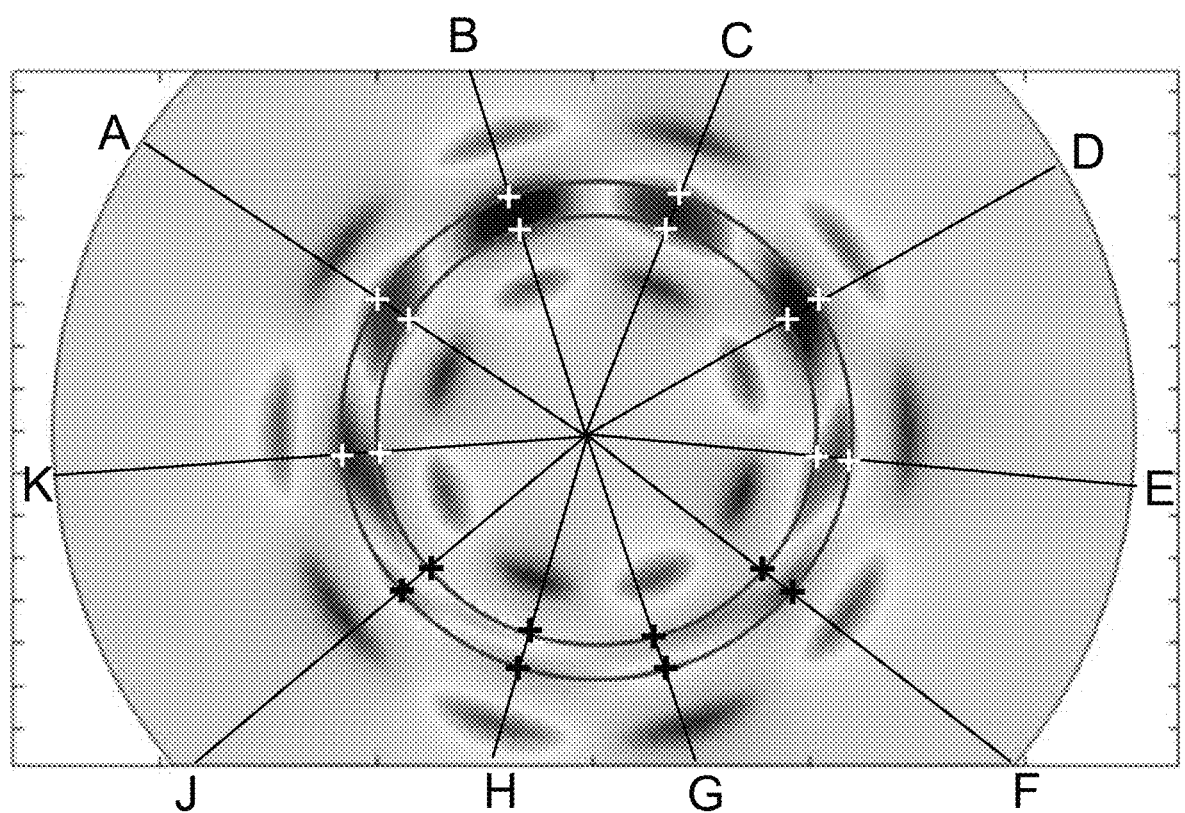
FIG. 16 is a duplicate of FIG. 3(c), with information added.

Reference is made to FIG. 16 which is a duplicate of FIG. 3(c), with information added. Indeed, when trying to find a solution to detect the radial offset, the inventors discovered that the simulation of FIG. 3(c) surprisingly also shows "unexpected regions" which seem to appear especially between the two circles defined by the first and second sensor location P1, P2. This was not at all expected. In fact, ten interesting angular locations are indicated by letters A to K, which may be particularly interesting for determining not only the presence but also the amount of radial offset based on the signal |Bx1−Bx2| or Bx1−Bx2)/(Bx1+Bx2). Indeed, in locations A, B, C, D, the radial gradient should be approximately equal to zero, if the sensor device is not radially shifted (with respect its original position). If the sensor device is radially shifted inwards, the signal at the second (outer) sensor location P2 will be larger (in absolute value) than the signal at the inner sensor location P1. Likewise, if the sensor is shifted radially outwards, the signal at P2 will be smaller in absolute value than the signal at P1. Thus, at the angular locations A, B, C or D, the radial gradient dBx/dx is an excellent indicator for the radial shift of the sensor device. More in particular: (i) comparing this magnitude with a predefined threshold can be used to detect radial shift, (ii) the sign of dBx/dx is an indicator for the direction of the radial shift of the sensor device (inwardly or outwards), (iii) and the amplitude of dBx/dx, or the relative amplitude (Bx1−Bx2)/(Bx1+Bx2) is an indicator for the amount of radial shift. But the locations A, B, C, D may not be the only interesting locations, since also at the angular locations F, G, H, J the amplitude of the radial gradient will strongly vary in case of radial shift. Thus in these locations, the radial gradient dBx/dx or the relative gradient may also be used to determine the amount of radial shift of the sensor device. The angular locations E and K may also be used, but seem less useful than the other angular positions. It is of course also possible to combine the information obtained from various angular locations in order to determine the radial offset. Referring back to FIG. 14, it can now be better understood that in a particular embodiment of this method, step d) comprises making use of the radial signal Bx, or of the spatial gradient of that signal dBx/dx or of the ratiometric signal (Bx1−Bx2)/(Bx1+Bx2).

For completeness it is repeated that the signal dBx/dx is not the only possible way to determine radial offset of the sensor device, and there may be other ways to determine radial offset, as already stated above, e.g. based on the ratio, or the maximum ratio of the signals By, Bz.

FIG. 15(a) shows an angular position sensor system 1500a comprising a magnetic source 1510a comprising two concentric tracks located in a single plane, and a sensor device 1520a arranged above or below that plane. In the example, the first track T1 is formed by an inner ring having eight pole pairs, and the second track T2 is formed by an outer ring having ten pole pairs. These rings are preferably axially magnetized. The sensor device "sees" eight poles when moving over the inner ring, and "sees" ten poles when moving over the outer ring (or when the sensor device is stationary and the magnetic source is rotated). The centrelines 223, 224 of these tracks are two concentric circles having a different radius. The centrelines 223, 224 are spaced apart by a track distance "dt" in the radial direction. The distance between the sensor locations P1 and P2 of the sensor device is "ds", which is smaller than the track distance "dt", preferably at least 20% smaller. The first and second sensor location P1, P2 are preferably located on a virtual line X which is radially oriented with respect to the magnetic source. There may be an uncoded region, e.g. in the form of a circular groove situated between the tracks T1, T2, optionally filled with a non-magnetic material.

FIG. 15(b) shows an angular position sensor system 1500b comprising a magnetic source 1510b comprising two cylindrical tracks having a same radius, and a sensor device 1520b arranged as a satellite movable around these cylindrical tracks (or vice versa). The centrelines 223, 224 of the first and second track T1, T2 is a first circle and a second circle, a portion of which is shown in FIG. 15(b). These centrelines 223, 224 are spaced apart by a track distance "dt" in the axial direction A. There may be an uncoded region, e.g. in the form of a circular groove situated between the tracks T1, T2, optionally filled with a non-magnetic material.

FIG. 15(c) shows a linear position sensor system 1500c comprising a magnetic source 1510c comprising two parallel, linear tracks T1, T2 located in a single plane, and a sensor device 1520c arranged above or below that plane. Also shown is an orthogonal coordinate system connected to the magnetic source, comprising a height direction H, a longitudinal direction L, and a transverse direction T. In the example shown, the first track T1 is formed by a first multi-pole magnet having eight pole pairs, and the second track T2 is formed by a second multi-pole magnet having ten pole pairs. These magnets are preferably magnetized in the height direction H. The sensor device 1520c "sees" eight poles (four North poles and four south poles) of the first track T1, and ten poles of the second track T2, when moving over the magnetic structure in the longitudinal direction L (or vice versa). The centrelines 223, 224 of these tracks are two parallel lines, spaced apart by a track distance "dt" in the transverse direction T. There may be an uncoded region, e.g. in the form of a circular groove situated between the tracks T1, T2, optionally filled with a non-magnetic material.

The position sensor systems of FIG. 15(a) to FIG. 15(c) are of course only examples, and the present invention is not limited thereto, but only by the claims. For example, the number of pole pairs of each track may be different from those illustrated in the examples, and the sensor device may have other sensor structures, e.g. as illustrated in FIG. 8(a) to FIG. 8(h), or other suitable sensor structures.

FIG. 16 is already discussed above, when discussing the method of FIG. 14.

The invention claimed is:

1. A position sensor system for determining a position of a sensor device movable along a predefined path relative to a magnetic source or vice versa, the position sensor system comprising:
    said magnetic source comprising a first plurality of magnetic pole pairs arranged along a first track having a first periodicity (or pole distance), and comprising a second plurality of magnetic pole pairs arranged along a second track having a second periodicity different from the first periodicity, wherein a centreline of the first track is spaced from a centreline of the second track by a predefined track distance;
    said sensor device being configured for measuring a first set of a least two orthogonal magnetic field components at a first sensor location, and for measuring a second set of at least two orthogonal magnetic field components at a second sensor location,
    wherein the first sensor location is spaced from the second sensor location by a predefined sensor distance smaller than the predefined track distance, in a direction transverse to the tracks; and wherein the sensor device further comprises a processing unit configured for determining said position based on at least some of the measured signals.

2. The position sensor system according to claim 1, wherein the predefined sensor distance is 20% to 80% of the predefined track distance.

3. The position sensor system according to claim 1, wherein the predefined sensor distance is at most 75% of the predefined track distance.

4. The position sensor system according to claim 1, wherein the predefined sensor distance is at least 20% of the predefined track distance.

5. The position sensor system according to claim 1, wherein the position sensor system is an angular position sensor system.

6. The position sensor system according to claim 5,
wherein the magnetic source is rotatable about a rotation axis; and
wherein the first track and the second track are concentric circular tracks located in a single plane perpendicular to the rotation axis.

7. The position sensor system according to claim 5,
wherein the magnetic source is rotatable about a rotation axis and
wherein the first track and the second track are cylindrical tracks about said rotation axis, and spaced apart along said rotation axis;
wherein the first track has a first outer radius , and the second track has a second outer radius equal to the first outer radius.

8. The position sensor system according to claim 5,
wherein the first number of pole pairs is a value in the range from 4 to 15; and
wherein the second number of pole pairs is a value in the range from 5 to 16.

9. The position sensor system according to claim 1,
wherein the position sensor system is a linear position sensor system; and
wherein the first track is the first linear segment, and the second track is the second linear segment parallel to the first linear segment.

10. The position sensor system according to claim 1, wherein the processing unit is configured for:
estimating a transverse position of the sensor device relative to the magnetic tracks, based on at least some of the measured magnetic field components; and
determining the position of the sensor device based on at least some of the measured magnetic field components and based on the estimate transverse position.

11. The position sensor system according to claim 1, wherein the processing unit is configured for:
calculating a first set of quadrature components and a second set of quadrature components based on at least some of the measured components, using a predefined set of coefficients; and
determining the position of the sensor device based on the first and second set of quadrature components.

12. The position sensor system according to claim 1, wherein the processing unit is configured for:
estimating a transverse position of the sensor device relative to the magnetic tracks, based on at least some of the measured components, and determining a set of coefficients based on the estimated transverse position; and
calculating a first set of quadrature components and a second set of quadrature components based on at least some of the measured components, using the set of coefficients determined in step b);
determining the position of the sensor device based on the first and second set of quadrature components.

13. A method of determining a position of a sensor device movable along a predefined path relative to a magnetic source or vice versa, the magnetic source comprising a first plurality of magnetic pole pairs arranged along a first track having a first periodicity, and comprising a second plurality of magnetic pole pairs arranged along a second track having a second periodicity different from the first periodicity,
wherein centrelines of the tracks are spaced apart by a predefined track distance, the method comprising:
a) measuring at least two orthogonal magnetic field components at a first sensor location, and measuring at least two orthogonal magnetic field components at a second sensor location, spaced from the first sensor location by a predefined sensor distance smaller than the predefined track distance in a direction transverse to the tracks;
b) determining the position of the sensor device based on at least some of the measured magnetic field components.

14. The method according to claim 13,
wherein step a) comprises:
i) measuring at least two or at least three orthogonal magnetic field components at a first sensor location, and
ii) measuring at least two or at least three orthogonal magnetic field components at a second sensor location, spaced from the first sensor location by a predefined sensor distance smaller than the predefined track distance in a direction transverse to the tracks; and
wherein step b) comprises:
i) estimating a transverse position of the sensor device relative to the tracks based on at least some of the measured magnetic field components;
ii) determining the position of the sensor device based on at least some of the measured magnetic field components and based on the estimated transverse position.

15. The method according to claim 13, wherein step b) comprises:
i) calculating a first set of quadrature components and a second set of quadrature components based on at least some of the measured magnetic field components, using a set of equations with a predefined set of coefficients;
ii) determining the position of the sensor device based on the first and second set of quadrature components.

* * * * *